(12) United States Patent
Wiegman

(10) Patent No.: US 11,682,868 B2
(45) Date of Patent: Jun. 20, 2023

(54) CONNECTOR WITH OVERVOLTAGE PROTECTION AND METHODS OF USE FOR CHARGING AN ELECTRIC AIRCRAFT

(71) Applicant: BETA AIR, LLC, South Burlington, VT (US)

(72) Inventor: Herman Wiegman, South Burlington, VT (US)

(73) Assignee: BETA AIR, LLC, South Burlington, VT (US)

( * ) Notice: Subject to any disclaimer, the term of this patent is extended or adjusted under 35 U.S.C. 154(b) by 16 days.

(21) Appl. No.: 17/515,515

(22) Filed: Oct. 31, 2021

(65) Prior Publication Data
US 2023/0137016 A1    May 4, 2023

(51) Int. Cl.
*H02J 7/00* (2006.01)
*H01R 13/66* (2006.01)
*G01R 31/66* (2020.01)

(52) U.S. Cl.
CPC ......... *H01R 13/6683* (2013.01); *G01R 31/66* (2020.01); *H01R 13/6666* (2013.01); *H02J 7/0036* (2013.01); *H02J 7/00308* (2020.01)

(58) Field of Classification Search
CPC ......... H01M 2010/4271; B64C 39/024; B64C 2201/042; B64C 2201/066; B64C 2201/127; B64C 2201/146; B64C 2201/027; B64C 2201/108; B64C 2201/08; B60L 2200/10; H02J 7/0071; H02J 7/0029
USPC ........................................................ 320/107
See application file for complete search history.

(56) References Cited

U.S. PATENT DOCUMENTS

| 6,331,763 | B1* | 12/2001 | Thomas | H02J 7/00308 |
| | | | | 320/136 |
| 10,193,370 | B1* | 1/2019 | Schweitzer | B64C 39/024 |
| 10,826,137 | B2 | 11/2020 | Zheng | |
| 11,059,386 | B2 | 7/2021 | Demont | |
| 2017/0297445 | A1* | 10/2017 | Zheng | B64D 5/00 |
| 2019/0148951 | A1* | 5/2019 | Wang | B60L 53/66 |
| | | | | 320/109 |
| 2020/0076205 | A1* | 3/2020 | Luo | H01M 10/44 |

(Continued)

FOREIGN PATENT DOCUMENTS

| CN | 110920427 A | 3/2020 |
| GB | 2583973 A | 11/2020 |

(Continued)

*Primary Examiner* — Zixuan Zhou
(74) *Attorney, Agent, or Firm* — Caldwell Intellectual Property Law

(57) ABSTRACT

A connector with overvoltage protection, and methods of use, for charging an electric aircraft. The connector includes a housing, at least a current conductor, a protection circuit, at least a sensor and a controller. The housing is configured to mate with an electric aircraft port of the electric aircraft. The at least a current conductor is configured to conduct a current. The protection circuit is configured to control transmission of electrical power through the connector. The at least a sensor is configured to detect an output voltage of the connector. The controller is communicatively connected to the at least a sensor. The controller is configured to determine an overvoltage output as a function of the output voltage, and activate the protection circuit based on detection of the overvoltage output.

20 Claims, 6 Drawing Sheets

(56) References Cited

U.S. PATENT DOCUMENTS

| | | |
|---|---|---|
| 2020/0307399 A1 | 10/2020 | Lashbrook |
| 2020/0307407 A1 | 10/2020 | Fischer |
| 2020/0338989 A1 | 10/2020 | Zhang |
| 2021/0101680 A1 | 4/2021 | Naderi |
| 2021/0175755 A1* | 6/2021 | Lee .................. B60L 53/62 |
| 2021/0229566 A1 | 7/2021 | Hao |

FOREIGN PATENT DOCUMENTS

| | | | |
|---|---|---|---|
| WO | WO-2016146045 A1 * | 9/2016 | ............ A45C 11/24 |
| WO | 2019000255 | 1/2019 | |
| WO | 2019179126 | 9/2019 | |
| WO | 2021023986 A1 | 2/2021 | |

* cited by examiner

US 11,682,868 B2

CONNECTOR WITH OVERVOLTAGE PROTECTION AND METHODS OF USE FOR CHARGING AN ELECTRIC AIRCRAFT

FIELD OF THE INVENTION

The present invention generally relates to the field of electric vehicle chargers. In particular, the present invention is directed to a connector with overvoltage protection and methods of use for charging an electric aircraft.

BACKGROUND

Electric vehicles typically derive their operational power from onboard rechargeable batteries. However, it can be a complex task to implement charging of these batteries in a safe manner.

SUMMARY OF THE DISCLOSURE

In an aspect a connector with overvoltage protection for charging an electric aircraft is provided. The connector includes a housing, at least a current conductor, a protection circuit, at least a sensor and a controller. The housing is configured to mate with an electric aircraft port of the electric aircraft. The at least a current conductor is configured to conduct a current. The at least a current conductor is configured to make a connection with a mating component on the electric aircraft port when the housing is mated with the electric aircraft port. The protection circuit is configured to control transmission of electrical power through the connector. The at least a sensor is configured to detect an output voltage of the connector. The controller is communicatively connected to the at least a sensor. The controller is configured to determine an overvoltage output as a function of the output voltage, and activate the protection circuit based on detection of the overvoltage output.

In another aspect a method, of using a connector with overvoltage protection, for charging an electric aircraft is provided. The method includes mating a housing of a connector with an electric aircraft port of an electric aircraft, conducting, using at least a current conductor, a current, controlling, using a protection circuit, transmission of electrical power through the connector, detecting, using at least a sensor, an output voltage of the connector, and determining, using a controller communicatively connected to the at least a sensor, an overvoltage output as a function of the output voltage, and activating, using the controller, the protection circuit based on detection of the overvoltage output. Mating the housing with the electric aircraft port further includes connecting the at least a current conductor with a mating component on the electric aircraft port.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

Figure 1:
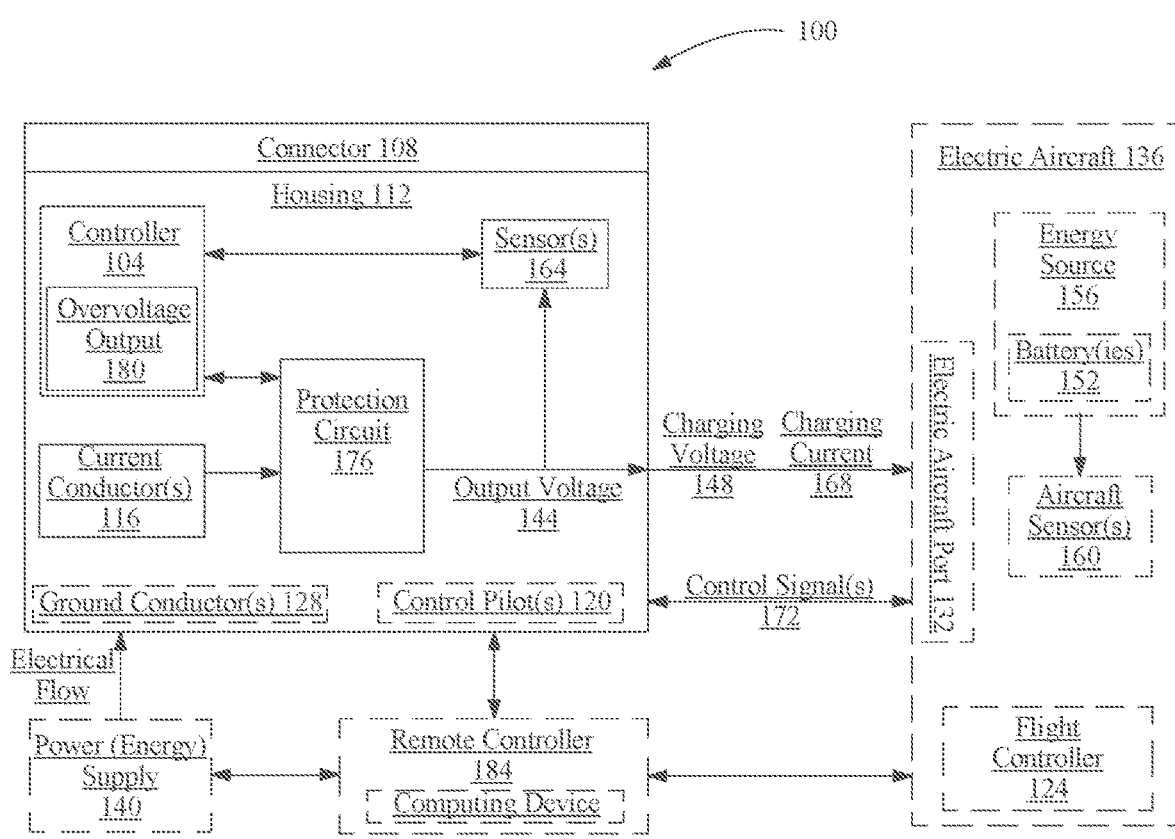
FIG. 1 is a block diagram of an exemplary embodiment of a system including a connector with overvoltage protection for charging an electric aircraft.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

In the following description, for the purposes of explanation, numerous specific details are set forth in order to provide a thorough understanding of the present invention. It will be apparent, however, that the present invention may be practiced without these specific details. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper", "lower", "left", "rear", "right", "front", "vertical", "horizontal", "upward", "downward", "forward", "backward" and derivatives thereof shall relate to the orientation in FIG. 2. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

At a high level, aspects of the present disclosure are directed to a connector with overvoltage protection and methods of use for charging an electric aircraft. In an embodiment, this can be accomplished by a controller configured to determine an overvoltage output as a function of an output or charging voltage of connector. Aspects of the present disclosure can desirably be used to protect a battery during charging. Aspects of the present disclosure can also be desirably used to protect an electric aircraft which is being charged. This is so, at least in part, because connector can include a protection circuit which can be activated on determination or detection of an overvoltage output by controller and/or an associated sensor. Aspects of the present disclosure advantageously allow for automatic termination and/or regulation of output or charging voltage during charging thereby desirably providing a safeguard so that potential damage to electric aircraft can be avoided and safety is maintained. Exemplary embodiments illustrating aspects of the present disclosure are described below in the context of several specific examples.

Referring now to FIG. 1, an exemplary embodiment of a system 100, which, in some embodiments, includes a connector 108 with overvoltage protection, is illustrated. System 100 may be used in support of an electric aircraft. For instance, system 100 may be used to charge and/or recharge an electric aircraft. In some cases, system 100 may be tethered to electric aircraft during support. In some cases, system 100 may be tethered to a physical location on ground, for example an electrical power supply or source. Alternatively, system 100 may not be tethered to a physical location on the ground and may be substantially free to move when not tethered to an electric vehicle. System 100 may be configured to charge and/or recharge an electric aircraft. As used in this disclosure, "charging" or "recharging" refers to a process of increasing energy stored within an energy source. In some cases, an energy source may include at least a battery and charging may include providing an electrical flow or current to at least a battery. As used in this disclosure, an "electrical flow" or "current" is a flow of charged particles (e.g. electrons) or an electric current flowing within a material or structure which is capable of conducting it. Current may be measured in amperes or the like. As used in this disclosure, a "battery pack" is a set of any number of identical (or non-identical) batteries or individual battery cells. These may be configured in a series, parallel or a mixture of both configuration to deliver a desired electrical flow, current, voltage, capacity, or power density, as needed or desired. A battery may include, without limitation, one or more cells, in which chemical energy is converted into electricity (or electrical energy) and used as a source of energy or power.

Still referring to FIG. 1, in some embodiments, system 100 and/or connector 108 may be used to provide overvoltage protection to an energy source, battery pack, battery module, battery unit, battery or cell of electric aircraft. This may be done during charging or recharging of electric aircraft by system 100 and/or connector 108. As used in this disclosure, "overvoltage" is a voltage that exceeds a maximum value of operating voltage in a circuit or part of it. Overvoltage can damage a circuit and associated components, and may be dangerous in some circumstances. For example, and without limitation, an overvoltage condition may occur if the voltage in a circuit or part of it is raised above its upper design limit. As used in this disclosure, "overvoltage protection" is an attribute of a device, system or method which provides safeguarding from an overvoltage condition. Overvoltage protection can support not only safe operation but also a defense against damage to equipment and componentry.

Still referring to FIG. 1, in some embodiments, connector 108 includes a controller 104. Controller 104 may be communicatively connected to connector 108 and/or any of its components. As used in this disclosure, a "controller" is any circuit element, or combination thereof, that is configured to control a subsystem or system. Controller 104 may be a part of another circuit. Controller 104 may, in some embodiments, be used to control and/or activate an overvoltage protection circuit as described in further detail below. For example, and without limitation, controller 104 may include an analog circuit including one or more operational amplifiers and/or transistors. In another example, and without limitation, controller 104 may include a logic circuit including one or more logic gates. As used in this disclosure, a "logic circuit" is a circuit for performing logical operations on signal (e.g. input signals). In yet another example, and without limitation, controller 104 controller 104 may include a processor. In some cases, controller 104 may include, for example and without limitation, a single circuit element such as a switch, a fuse, a circuit breaker switch or a single transistor. Controller 104 may also include, for example and without limitation, an application-specific integrated circuit (ASIC), a field programmable gate array (FPGA), a microcontroller and/or a computing device.

Still referring to FIG. 1, controller 104 may include any computing device as described in this disclosure, including without limitation a microcontroller, microprocessor, digital signal processor (DSP) and/or system on a chip (SoC) as described in this disclosure. Computing device may include, be included in, and/or communicate with a mobile device such as a mobile telephone or smartphone. Computing device may include a single computing device operating independently, or may include two or more computing device operating in concert, in parallel, sequentially or the like; two or more computing devices may be included together in a single computing device or in two or more computing devices. Computing device may interface or communicate with one or more additional devices as described below in further detail via a network interface device. Network interface device may be utilized for connecting computing device to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Computing device may include but is not limited to, for example, a computing device or cluster of computing devices in a first location and a second computing device or cluster of computing devices in a second location. Computing device may include one or more computing devices dedicated to data storage, security, distribution of traffic for load balancing, and the like. Computing device may distribute one or more computing tasks as described below across a plurality of computing devices of computing device, which may operate in parallel, in series, redundantly, or in any other manner used for distribution of tasks or memory between computing devices. Computing device may be implemented using a "shared nothing" architecture in which data is cached at the worker, in an embodiment, this may enable scalability of system 100 and/or computing device.

With continued reference to FIG. 1, computing device may be designed and/or configured to perform any method, method step, or sequence of method steps in any embodiment described in this disclosure, in any order and with any degree of repetition. For instance, computing device may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Computing device may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Still referring to FIG. 1, as used in this disclosure, "communicatively connected" is an attribute of a connection, attachment or linkage between two or more relata which allows for reception and/or transmittance of information therebetween. For example, and without limitation, this connection may be wired or wireless, direct or indirect, and between two or more components, circuits, devices, systems, and the like, which allows for reception and/or transmittance of data and/or signal(s) therebetween. Data and/or signals therebetween may include, without limitation, electrical, electromagnetic, magnetic, video, audio, radio and microwave data and/or signals, combinations thereof, and the like, among others. A communicative connection may be achieved, for example and without limitation, through wired or wireless electronic, digital or analog, communication, either directly or by way of one or more intervening devices or components. Further, communicative connection may include electrically coupling or connecting at least an output of one device, component, or circuit to at least an input of another device, component, or circuit. For example, and without limitation, via a bus or other facility for intercommunication between elements of a computing device. Communicative connecting may also include indirect connections via, for example and without limitation, wireless connection, radio communication, low power wide area network, optical communication, magnetic, capacitive, or optical coupling, and the like. In some instances, the terminology "communicatively coupled" may be used in place of communicatively connected in this disclosure.

With continued reference to FIG. 1, in some embodiments, connector 108 with overvoltage protection for charging an electric aircraft is provided. Connector 108 includes a housing 112, at least a current conductor 116, a protection circuit 176, at least a sensor 164 and controller 104. Housing 112 is configured to mate with an electric aircraft port 132 of an electric aircraft 136. At least a current conductor 116 is configured to conduct a current. At least a current conductor 116 is configured to make a connection with a mating component on electric aircraft port 132 when housing 112 is mated with electric aircraft port 132. Protection circuit 176 is configured to control transmission of electrical power through connector 108. At least a sensor 164 is configured to detect an output voltage 144 of connector 108. Controller 104 is communicatively connected to at least a sensor 164. Controller 104 is configured to determine an overvoltage output 180 as a function of output voltage 144, and activate protection circuit 176 based on detection of overvoltage output 180.

Figure 2:
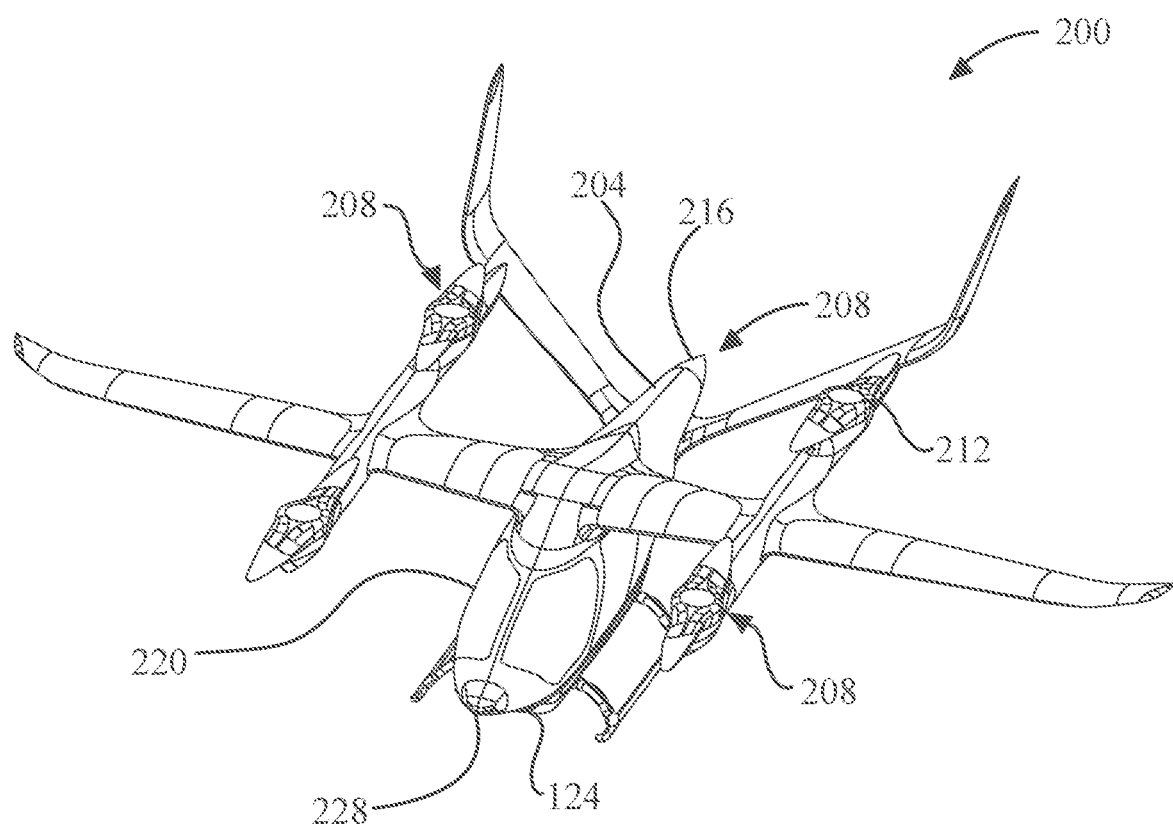
FIG. 2 is a diagrammatic representation of an exemplary embodiment of an electric aircraft.

Still referring to FIG. 1, connector 108 may further include, without limitation, one or more ground conductor(s) 128 and one or more control pilot(s) or control signal conductor(s) 120. Connector 108 may receive an electrical flow from a power (or energy) supply (or source) 140. Connector 108 may also be communicatively connected to a remote controller 184 or other computing device. Electric aircraft 136 may include, without limitation, an energy source 156 (or battery pack) which may include one or more battery(ies) 152, a flight controller 124, and one or more aircraft sensor(s) which may include a battery sensor or the like. As also noted below, as used in this disclosure, "remote" is a spatial separation between two or more elements, systems, components or devices. Stated differently, two elements may be remote from one another if they are physically spaced apart. Electric aircraft 136 may include an of the aircrafts as disclosed herein. In an embodiment, electric aircraft 136 may include an electric vertical takeoff and landing (eVTOL) aircraft. FIG. 2 also illustrates an electric aircraft in accordance with some exemplary embodiments.

Still referring to FIG. 1, connector 108 may be configured in various manners, as needed or desired, for example and without limitation, to facilitate charging or recharging of electric aircraft 136. As used in this disclosure, a "connector" is a distal end of a tether or a bundle of tethers, e.g., hose, tubing, cables, wires, and the like, which is configured to removably attach with a mating component, for example without limitation a port. As used in this disclosure, a "port" is an interface for example of an interface configured to receive another component or an interface configured to transmit and/or receive signal on a computing device. For example in the case of an electric vehicle port, the port may interface with a number of conductors and/or a coolant flow path by way of receiving a connector. In the case of a computing device port, the port may provide an interface penetrative form and port may include a female component having a receptive form, receptive to the male component. Alternatively or additionally, connector may have a female component and port may have a male component. In some cases, connector may include multiple connections, which may make contact and/or communicate with associated mating components within port, when the connector is mated with the port. Certain features of systems, methods and connectors including a charging connector, controller and associated components and devices, which may efficaciously be utilized in accordance with certain embodiments of the present disclosure are disclosed in U.S. Nonprovisional application Ser. No. 17/405,840, filed on Aug. 18, 2021, entitled "CONNECTOR AND METHODS OF USE FOR CHARGING AN ELECTRIC VEHICLE," the entirety of which is incorporated herein by reference.

Still referring to FIG. 1, connector 108 may be used to charge or recharge a battery, for example, and without limitation, that of an electric aircraft. Connector may also be referred to in this disclosure as charging connector or charger. Connector, charging connector or charger may efficaciously include, without limitation, a constant voltage charger, a constant current charger, a taper current charger, a pulsed current charger, a negative pulse charger, an IUI charger, a trickle charger, a float charger, a random charger, and the like, among others. Connector, charging connector or charger may include any component configured to link an electric vehicle to the connector, charging connector or charger.

Continuing to refer to FIG. 1, housing 112 of connector 108 may include, house or contain various components, as needed or desired. As used in this disclosure, a "housing" is a physical component within which other internal components are located. In some cases, internal components with housing will be functional while function of housing may largely be to protect the internal components. Housing and/or connector may be configured to mate with a port, for example electrical aircraft port 132. As used in this disclosure, "mate" is an action of attaching two or more components together. As used in this disclosure, an "electric aircraft port" is a port located on electric aircraft 136. Mating may be performed using a mechanical or electromechanical means described in this disclosure. For example, without limitation mating may include an electromechanical device used to join electrical conductors and create an electrical circuit. In some cases, mating may be performed by way of gendered mating components. A gendered mate may include a male component or plug which is inserted within a female component or socket. In some cases, mating may be removable. In some cases, mating may be permanent. In some cases, mating may be removable, but require a specialized tool or key for removal. Mating may be achieved by way of one or more of plug and socket mates, pogo pin contact, crown spring mates, and the like. In some cases, mating may be keyed to ensure proper alignment of connector 108. In some cases, mate may be lockable. As used in this disclosure, a "mating component" is a component that is configured to mate with at least another component, for example in a certain (i.e., mated) configuration. As used in this disclosure, an "electric vehicle" is any electrically powered means of human transport, for example without limitation an electric aircraft or electric vertical take-off and landing (eVTOL) aircraft. In some cases, an electric vehicle or aircraft may include an energy source configured to power at least a motor configured to move the electric vehicle or aircraft. As used in this disclosure, an "electric aircraft" is an electrically powered aircraft such as one powered by one or more electric motors or the like. In some embodiments, electric (or electrically powered) aircraft may be an electric vertical takeoff and landing (eVTOL) aircraft. FIG. 2 illustrates an electric aircraft in accordance with some exemplary embodiments.

Still referring to FIG. 1, housing 112 may efficaciously be fabricated from various suitable materials, as needed or desired. In some embodiments, housing 112 may be fabricated from an electrically non-conducting material which may desirably be lightweight and have sufficient structural strength. In some cases, and without limitation, housing 112 may include a plastic or a thermoplastic material. For example, and without limitation, housing 212 may include an elastomer, a polyurethane, a thermoplastic polyurethane (TPU), a polycarbonate, a polycarbonate blend and/or a polycarbonate resin, combinations thereof, and the like, among others. Other suitable materials for housing may include ceramics, and the like.

With continued reference to FIG. 1, connector (or charging connector) 108 and/or housing 112 of connector may include a fastener. As used in this disclosure, a "fastener" is a physical component that is designed and/or configured to attach or fasten two (or more) components together. Connector may include one or more attachment components or mechanisms, for example without limitation fasteners, threads, snaps, canted coil springs, and the like. In some cases, connector may be connected to port by way of one or more press fasteners. As used in this disclosure, a "press fastener" is a fastener that couples a first surface to a second surface when the two surfaces are pressed together. Some press fasteners include elements on the first surface that interlock with elements on the second surface; such fasteners include without limitation hook-and-loop fasteners such as VELCRO fasteners produced by Velcro Industries B.V. Limited Liability Company of Curacao Netherlands, and fasteners held together by a plurality of flanged or "mushroom"-shaped elements, such as 3M DUAL LOCK fasteners manufactured by 3M Company of Saint Paul, Minn. Press-fastener may also include adhesives, including reusable gel adhesives, GECKSKIN adhesives developed by the University of Massachusetts in Amherst, of Amherst, Mass., or other reusable adhesives. Where press-fastener includes an adhesive, the adhesive may be entirely located on the first surface of the press-fastener or on the second surface of the press-fastener, allowing any surface that can adhere to the adhesive to serve as the corresponding surface. In some cases, connector may be connected to port by way of magnetic force. For example, connector may include one or more of a magnetic, a ferro-magnetic material, and/or an electromagnet. Fastener may be configured to provide removable attachment between charging connector 108 and at least a port, for example, electric aircraft port 132. As used in this disclosure, "removable attachment" is an attributive term that refers to an attribute of one or more relata to be attached to and subsequently detached from another relata; removable attachment is a relation that is contrary to permanent attachment wherein two or more relata may be attached without any means for future detachment. Exemplary non-limiting methods of permanent attachment include certain uses of adhesives, glues, nails, engineering interference (i.e., press) fits, and the like. In some cases, detachment of two or more relata permanently attached may result in breakage of one or more of the two or more relata.

Still referring to FIG. 1, connector 108 may be configured to charge at least a battery 152 of electric aircraft 136. Connector (or charging connector) 108 and/or current conductor(s) 116 may be configured to charge or recharge electric aircraft 136 and/or battery(ies) 152 by conducting, transmitting or providing an electrical flow, charging current 168 and/or a charging voltage 148. In an embodiment, current conductor 116 may include an alternating current (AC) conductor configured to conduct an alternating current (AC). In an embodiment, current conductor 116 may include a direct current (DC) conductor configured to conduct a direct current (DC).

Still referring to FIG. 1, in some embodiments, connector 108 and/or current conductor(s) 116 may include at least an AC pin and/or at least a DC pin. DC pin may include any component responsible for the flow of DC power into and out of an electric vehicle such as electric aircraft 136. DC pin may include a live pin, such that the pin is a supply of DC power, a neutral pin, such that the pin is a return path for DC power, and the like, among others. AC pin may include any component responsible for the flow of AC power into and out of an electric vehicle such as electric aircraft 136. AC pin may include a live pin, such that the pin is a supply of AC power, a neutral pin, such that the pin is the return path for AC power, and the like, among others.

Still referring to FIG. 1, as used in this disclosure, a "conductor" is a component that facilitates conduction. As used in this disclosure, "conduction" is a process by which one or more of heat and/or electricity is transmitted through a substance, for example when there is a difference of effort (i.e., temperature or electrical potential) between adjoining regions. As also noted above, a "current" is a flow of charged particles (e.g. electrons) or an electric current flowing within a material or structure which is capable of conducting it. Current may be measured in amperes or the like. As used in this disclosure, a "current conductor" is a conductor capable of conducting a current or an electric current. In some cases, and without limitation, current conductor(s) 116 may be configured to charge and/or recharge an electric vehicle such as, without limitation, electric aircraft 136. For instance, current conductor 116 may be connected to a power (or energy) supply (or source) 140 and current conductor may be designed and/or configured to facilitate a specified amount of electrical power, current, or current type. For example, current conductor 116 may include a direct current (DC) conductor. As used in this disclosure, a "direct current conductor" is a conductor configured to carry a direct current for charging or recharging an energy source (e.g. battery of electric aircraft). As used in this disclosure, "direct current" is one-directional flow of electric charge. In some cases, current conductor 116 may include an alternating current (AC) conductor. As used in this disclosure, an "alternating current conductor" is a conductor configured to carry an alternating current for charging or recharging an energy source (e.g. battery of electric aircraft). As used in this disclosure, an "alternating current" is a flow of electric charge that periodically reverses direction; in some cases, and without limitation, an alternating current may change its magnitude continuously with time (e.g., sine wave).

Continuing to refer to FIG. 1, in an embodiment, system 100 and/or connector 108 may include an alternating current (AC) to direct current (DC) converter configured to convert an alternating current from power supply 140 to a direct current. As used in this disclosure, an "alternating current to direct current converter" is an electrical component that is configured to convert alternating current to direct current. An alternating current to direct current (AC-DC) converter may include an alternating current to direct current power supply and/or transformer. In some cases, AC-DC converter may be located within an electric vehicle or aircraft and conductors may provide an alternating current to the electric vehicle by way of connector 108. Alternatively and/or additionally, in some cases, AC-DC converter may be located outside of electric vehicle or aircraft and an electrical charging current may be provided by way of a direct current to electric vehicle or aircraft.

With continued reference to FIG. 1, in some embodiments, current conductor 116 may be in electric communication with (and/or be communicatively connected to) a power supply 140. Conductor may be a physical device and/or object that facilitates conduction, for example electrical conduction and/or thermal conduction. In some cases, conductor may be an electrical conductor, for example a wire and/or cable. Exemplary conductor materials include metals, such as without limitation copper, nickel, steel, and the like. As used in this disclosure, "communication" is an attribute wherein two or more relata interact with one another, for example within a specific domain or in a certain manner. In some cases communication between two or more relata may be of a specific domain, such as without limitation electric communication, fluidic communication, informatic communication, mechanic communication, and the like. As used in this disclosure, "electric communication" is an attribute wherein two or more relata interact with one another by way of an electric current or electricity in general. As used in this disclosure, "fluidic communication" is an attribute wherein two or more relata interact with one another by way of a fluidic flow or fluid in general. As used in this disclosure, "informatic communication" is an attribute wherein two or more relata interact with one another by way of an information flow or information in general. As used in this disclosure, "mechanic communication" is an attribute wherein two or more relata interact with one another by way of mechanical means, for instance mechanic effort (e.g., force) and flow (e.g., velocity).

Still referring to FIG. 1, connector 108, current conductor (s) 116, controller 104 and/or remote controller 188 may be connected, communicatively or otherwise, to power supply 140 which provides an electrical flow to connector 108. Controller 104 may regulate, control and/or optimize a charging voltage 148 and/or charging current 168 that emanates from connector 108 to electric aircraft 136. This charging voltage 148 and/or charging current 168 may be used to charge or recharge energy source 156 and/or battery 152 of electric aircraft 136. As used in this disclosure, a "charging voltage" is an electrical flow at a predetermined voltage (and/or associated current) which may be constant or variable. As used in this disclosure, a "charging current" is an electrical flow at a predetermined current (and/or associated voltage) which may be constant or variable. This electrical flow of electrical charge facilitates an increase in stored electrical energy of an energy storage device, such as without limitation a battery. In some embodiments, charging voltage 148 and/or charging current 168 may be provided in a plurality of phases or stages to optimize charging of energy source 156 and/or battery 152. Each charging phase or stage may have a prescribed and/or optimized charging voltage and/or current which may be variable or constant. Any number of charging phases or stages may be utilized, as needed or desired, with each including a prescribed and/or optimized charging voltage and/or current.

With continued reference to FIG. 1, in some embodiments, protection circuit 176 is configured to control transmission of electrical power through the connector 108. "Electrical power," as used in this disclosure, is defined as a rate of electrical energy per unit time. Electrical power is a function of at least voltage and/or current, such as at least output voltage 144. In some cases, and without limitation, electrical power may be a function of charging voltage 148 and/or charging current 168.

Still referring to FIG. 1, protection circuit 176 may be in electrical communication with current conductor 116 to transmit output voltage 144 therefrom. Protection circuit 176 may be communicatively connected to controller 104 to receive signals therefrom and transmit signals thereto. Protection circuit 176 may also be communicatively connected to control pilot 120 and/or remote controller 184.

Still referring to FIG. 1, protection circuit 176 may include any number of suitable circuits configured to control and/or regulate at least output voltage 144 (or charging voltage 148) of connector 108. As used in this disclosure, a "protection circuit" is a circuit which provides a safety mechanism during use of a charger. For example, and without limitation, protection circuit 176 may terminate transmission of electrical power, voltage and/or current to a charging target (e.g. battery 152) on detection of an overload condition or overvoltage. In another example, and without limitation, protection circuit 176 may lower and/or modify transmission of electrical power, voltage and/or current to charging target (e.g. battery 152) on detection of an overload condition or overvoltage. Protection circuit, without limitation, may be considered to provide means to trip the charging circuit (or shut off or disrupt electrical flow therethrough) in the event of an overload condition or overvoltage.

Still referring to FIG. 1, protection circuit 176 may include any suitable circuit and/or circuit breaker. For example, and without limitation, protection circuit 176 may include a Zener voltage regulator circuit, Zener diode circuit, transient voltage suppression (TVS) diode, crowbar protection circuit, voltage clamping circuit, voltage limiting circuit, a metal oxide varistor (MOV), thyristor surge protection device (TSPD), gas discharge tube (GDT), selenium voltage suppressor, carbon block spark gap overvoltage suppressor, quarter-wave coaxial surge arrestor, series mode (SM) surge suppressors, and the like, among others. In an embodiment, protection circuit 176 may include a Zener circuit. Protection circuit 176 may include one or more switches such as electrical switches or the like. These switches may be used to shut off (and/or turn on) electrical flow and/or regulate or control electrical flow through connector 108. Protection circuit may include one or more variable resistors, or the like, which may be used to regulate or control electrical flow and/or to shut off (and/or turn on) electrical flow through connector 108. Protection device 176 may include, without limitation, a surge protector, spike suppressor, surge suppressor, surge diverter, and the like, among other devices for providing protection from voltage spikes and/or surges. In some cases, and without limitation, protection device 176 may dissipate excess voltage to ground when the voltage is outside of a given range.

With continued reference to FIG. 1, in some embodiments, at least a sensor 164 is configured to detect output voltage 144 of connector 108. Output voltage 144 may be provided via current conductor(s) 116. Output voltage 144 may pass through protection circuit 176 or at least a part of it. Output voltage 144 may be the same or similar to charging voltage 148. Controller 104 is communicatively connected to sensor(s) 164.

Still referring to FIG. 1, as used in this disclosure, a "sensor" is a device that is configured to detect a phenomenon and transmit information related to the detection of the phenomenon. For example, in some cases a sensor may transduce a detected phenomenon, such as without limitation, voltage, current, speed, direction, force, torque, temperature, pressure, and the like, into a sensed signal. Sensor may include one or more sensors which may be the same, similar or different. Sensor may include a plurality of sensors which may be the same, similar or different. Sensor may include one or more sensor suites with sensors in each sensor suite being the same, similar or different.

Still referring to FIG. 1, sensor(s) 164 may include any number of suitable sensors which may be efficaciously used to detect output voltage 144. For example, and without limitation, these sensors may include a voltage sensor, current sensor, multimeter, voltmeter, ammeter, electrical current sensor, resistance sensor, impedance sensor, capacitance sensor, a Wheatstone bridge, displacements sensor, vibration sensor, Daly detector, electroscope, electron multiplier, Faraday cup, galvanometer, Hall effect sensor, Hall probe, magnetic sensor, optical sensor, magnetometer, magnetoresistance sensor, MEMS magnetic field sensor, metal detector, planar Hall sensor, thermal sensor, and the like, among others. Sensor(s) 164 (and/or aircraft sensor(s) 160) may efficaciously include, without limitation, any of the sensors disclosed in the entirety of the present disclosure. In an embodiment, sensor 164 may be a part of protection circuit 176. Stated differently, protection circuit 176 may include sensor 164. In an embodiment, sensor 164 may be protection circuit which serves to provide overvoltage protection in accordance with the teachings of the present disclosure.

Still referring to FIG. 1, as used in this disclosure, an "output voltage" is a voltage outputted from a charging device. Output voltage 144 may be provided to any energy source(s) and/or battery(ies) as disclosed herein, such as and without limitation, energy source 156 and/or battery 152 of electric aircraft 136. Output voltage 144 may include charging voltage 148. Output voltage is determined as a function of the particular configuration of a battery to be charged and/or its state charge (SOC). Output voltage may have a constant value (e.g. as a function of time), for example, and without limitation, depending on a maximum voltage or voltage capacity of a particular battery. Output voltage may have a variable value (e.g. as a function of time), for example, and without limitation, depending on the SOC of a battery and/or its charging phases or stages. Output voltage may be, for example and without limitation, a function of a charging rate to be supplied to battery. Output voltage may depend on whether battery is to be fully charged or whether it is to be charged to a certain state. As used herein, a "state of charge" is information on a charging level or available charge (or available voltage) of an energy source.

With continued reference to FIG. 1, in some embodiments, controller 104 is communicatively connected to sensor(s) 164. Controller 104 is, in some embodiments, also communicatively connected to at least protection circuit 176. Controller 104 may also be communicatively connected to other components such as, and without limitation, current conductor(s), control pilot(s), aircraft sensor(s), flight controller 124, power supply 140, remote controller 84 and/or electric aircraft 136, among others.

Still referring to FIG. 1, in some embodiments, controller 104 is configured to determine overvoltage output 180 as a function of output voltage 144, and activate (e.g. actuate and/or trigger) protection circuit 176 based on detection Sand/or determination) of overvoltage output 180. That is, on determination and/or detection of overvoltage output 180, controller 104 may send a signal to protection circuit 176 so as to terminate, regulate, control and/or modify output voltage 144, charging voltage 148 and/or charging current 168 as outputting or emanating from connector 108 to electric aircraft port 132. Other than protection circuit 176, controller 104 may also be communicatively connected to other components and may monitor and/or control their operation, as needed or desired.

Still referring to FIG. 1, in some embodiments, controller 104 is configured to determine overvoltage output 180 as a function of output voltage 144. Controller 104 may determine overvoltage output 180 by comparing output voltage 144 to a voltage threshold level. Threshold voltage level may include, without limitation, a threshold level of voltage an electric aircraft battery is capable to intake for charging purposes.

Still referring to FIG. 1, in an embodiment, activating or actuating, by controller 104, protection circuit 176 may include tripping protection circuit 176. Controller 104 may trip protection circuit 176 based on determination and/or detection of overvoltage output 180. Tripping protection circuit 176 may include any mechanism to shut off electrical flow through connector 108 as a function of detection of overvoltage output 180. Tripping protection circuit 176 may include, without limitation, use of any electrical switches or the like. As used herein, "tripping" is an act of disconnection. Tripping may involve automatically activating a mechanism, for example and without limitation, by using an electrical contact or switch, to shut-off electrical power as a precautionary or safety measure. Tripping may also include shorting or shunting circuits, which discharge electrical current by a low resistance bypass. In an embodiment, activating or actuating, by controller 104, protection circuit 176 may include terminating transmission of electrical power through connector 108. In an embodiment, activating or actuating, by controller 104, protection circuit 176 may include regulating output voltage 144. Regulation may involve decreasing (and in some cases, even increasing) the value of output voltage 144 and/or charging voltage 148 being outputted or emanating from connector 108.

With continued reference to FIG. 1, in an embodiment, overvoltage output 180 is determined as a function of state of charge (SOC) of at least a battery 152 of electric aircraft 136. As used in this disclosure, an "overvoltage output" is an output voltage that is higher than a required or desired threshold voltage. However, in some cases, overvoltage output may include an output voltage that is lower than a required or desired threshold voltage, for example and without limitation, when such an output voltage may be detrimental to battery, aircraft or charging process and/or unsafe or hazardous in any manner, and the like, among others. Overvoltage output may be determined, without limitation, by calculating, computing or detecting, a difference between a threshold voltage and the actual output voltage. For example, and without limitation, overvoltage output may include a threshold voltage which is a function of a maximum voltage rating of battery and/or a maximum charging voltage for a particular charging phase or stage. Overvoltage output may have a variable value (e.g. as a function of time), for example, and without limitation, depending on the SOC of a battery and/or its charging phases or stages. Overvoltage output may be, for example and without limitation, a function of a charging rate to be supplied to battery. Overvoltage output may depend on whether battery is to be fully charged or whether it is to be charged to a certain state. Overvoltage output may have a single value or it may have a range of values depending, for example and without limitation, on a configuration of a battery to be charged and/or its state charge (SOC).

Still referring to FIG. 1, in an embodiment, controller 104 may be attached to connector 104 such that they from a single device or unit. In another embodiment, controller 104 may be physically separated or remote from connector 108. In yet another embodiment, controller 104 and remote controller 184 may share and/or divide responsibilities. In still another embodiment, controller 104 may be replaced by remote controller 184. As also noted above, as used in this disclosure, "remote" is a spatial separation between two or more elements, systems, components or devices. Stated differently, two elements may be remote from one another if they are physically spaced apart. In an embodiment, controller 104 may be communicatively connected to electric aircraft 136.

With continued reference to FIG. 1, in an embodiment, sensor 164 may be a part of controller 104. Stated differently, controller 104 may include sensor 164. In another embodiment, controller 104 may be configured to detect output voltage 144. In other words, controller 104 may be configured to both detect output voltage 144 and determine overvoltage output 180 as a function of output voltage 144.

Still referring to FIG. 1, controller 104 may be configured to receive information, data and/or signals from battery 152, energy source 156 and/or electric aircraft 136 so as to determine overvoltage output 180. Energy source 156 may include, without limitation one or more battery packs, battery modules, battery units including one or more batteries 152 or battery cells. One or more aircraft (or battery) sensors 160 of aircraft 136 may be communicatively connected to energy source 156 and/or battery 152. Aircraft (or battery) sensor 160 may also be communicatively connected to flight controller 124. Aircraft and/or battery information may be communicated to controller 104 by aircraft (or battery) sensor 160 and/or to flight controller 124 of aircraft 136. Aircraft (or battery) sensor 160 and/or sensor 164 may efficaciously include any of the sensors as disclosed herein, including those configured to detect voltages and/or transmit voltage data for determination of overvoltage output.

Still referring to FIG. 1, in some embodiments, controller 104 may be configured to receive a battery sensor signal from electric aircraft 136. This may be done directly, or via control signals (s) 172 and/or control pilot(s) 120. As used in this disclosure, a "battery sensor signal" is a signal representative of a characteristic of a battery. In some cases, battery sensor signal may be representative of a characteristic of an electric vehicle or aircraft battery (e.g. battery 152), for example, during a pre-charging stage or phase and/or as electric vehicle or aircraft battery is being charged or recharged. In some versions, controller 104 may additionally include a sensor interface configured to receive a battery sensor signal. Sensor interface may include one or more ports, an analog to digital converter, and the like. Controller 104 may be further configured to control one or more of electrical charging current and/or coolant flow as a function of battery sensor signal and/or control signal. For example, controller 104 may control a coolant source and/or power supply 140 as a function of battery sensor signal and/or control signal. In some cases, battery sensor signal may be representative of battery temperature. In some cases, battery sensor signal may represent battery cell swell. In some cases, battery sensor signal may be representative of temperature of electric vehicle or aircraft battery, for example temperature of one or more battery cells within an electric vehicle or aircraft battery. In some cases, a sensor, a circuit, and/or a controller 104 may perform one or more signal processing steps on a signal. For instance, sensor, circuit or controller 104 may analyze, modify, and/or synthesize a signal in order to improve the signal, for instance by improving transmission, storage efficiency, or signal to noise ratio.

With continued reference to FIG. 1, exemplary methods of signal processing may include analog, continuous time, discrete, digital, nonlinear, and statistical. Analog signal processing may be performed on non-digitized or analog signals. Exemplary analog processes may include passive filters, active filters, additive mixers, integrators, delay lines, compandors, multipliers, voltage-controlled filters, voltage-controlled oscillators, and phase-locked loops. Continuous-time signal processing may be used, in some cases, to process signals which varying continuously within a domain, for instance time. Exemplary non-limiting continuous time processes may include time domain processing, frequency domain processing (Fourier transform), and complex frequency domain processing. Discrete time signal processing may be used when a signal is sampled non-continuously or at discrete time intervals (i.e., quantized in time). Analog discrete-time signal processing may process a signal using the following exemplary circuits sample and hold circuits, analog time-division multiplexers, analog delay lines and analog feedback shift registers. Digital signal processing may be used to process digitized discrete-time sampled signals. Commonly, digital signal processing may be performed by a computing device or other specialized digital circuits, such as without limitation an application specific integrated circuit (ASIC), a field-programmable gate array (FPGA), or a specialized digital signal processor (DSP). Digital signal processing may be used to perform any combination of typical arithmetical operations, including fixed-point and floating-point, real-valued and complex-valued, multiplication and addition. Digital signal processing may additionally operate circular buffers and lookup tables. Further non-limiting examples of algorithms that may be performed according to digital signal processing techniques include fast Fourier transform (FFT), finite impulse response (FIR) filter, infinite impulse response (IIR) filter, and adaptive filters such as the Wiener and Kalman filters. Statistical signal processing may be used to process a signal as a random function (i.e., a stochastic process), utilizing statistical properties. For instance, in some embodiments, a signal may be modeled with a probability distribution indicating noise, which then may be used to reduce noise in a processed signal.

Still referring to FIG. 1, in some embodiments, various types of voltage datum may be provided to controller 104 from electric aircraft 136. As used in this disclosure, a "voltage datum" is information on a voltage value, required or desired, for charging or recharging an energy source. Voltage datum may facilitate controller 104 in determining overvoltage output 180. Energy source may include any of the energy sources as disclosed herein, such as energy source 156 and/or battery(ies) 152. For example, and without limitation, voltage datum may include information on a current voltage capacity or state of charge of a battery, a maximum or threshold voltage which may be required or desired to fully charge a battery or bring it to a certain charged state, a charging voltage (fixed or variable) which may be required or desired by battery, and the like, among others. Voltage datum may include information on a single value of a range of values, as needed or desired. Voltage datum may include a constant value or a variable value as a function of time (or other suitable variable). Voltage datum may include information on a charging rate to be provided to energy source. In an embodiment, voltage datum includes information on a variable charging rate to be supplied to energy source or battery.

Still referring to FIG. 1, in an embodiment, voltage datum may include a state of charge datum. In an embodiment, voltage datum may include a maximum voltage datum. As used in this disclosure, a "state of charge datum" or "SOC datum" is information on an available charge (or available voltage) of an energy source. As used in this disclosure, a "maximum voltage datum" is information on a desired or required voltage at which an energy source would be fully or sufficiently charged. Voltage datum may provide information on battery 152 and/or its state of charging which can be used to then determine overvoltage output 180. For example, in some cases, battery 172 may tend to heat up as charging progresses and/or at certain phases of charging which can be related to a voltage and/or current associated with battery itself and/or charging voltage 148 and/or charging current 168. This may then be translated to an appropriate overvoltage output 180, for example, to maintain battery 152 at a particular temperature, temperature threshold and/or temperature range. In some cases, information relating to a flight plan of aircraft may also be used to determine this temperature, temperature threshold and/or temperature range. For example, and without limitation, longer flights, flights with larger payloads, flight s involving more transitions between vertical and horizontal flight, and the like, may have a different or lower required or desired pre-flight battery temperature, temperature threshold and/or temperature range. Other information may also be provided to controller 104 from electric aircraft 136 to facilitate in determining overvoltage output 180, such as and without limitation, thermal data on battery, and the like, among others. Any of remote controller 184 and/or flight controller 124 may assist controller 104 in its operation, as needed or desired.

Still referring to FIG. 1, in an embodiment, connector 108 may include ground conductor(s) 128. As used in this disclosure, a "ground conductor" is a conductor configured to be in electrical communication with a ground. As used in this disclosure, a "ground" is a reference point in an electrical circuit, a common return path for electric current, or a direct physical connection to the earth. Ground may include an absolute ground such as earth or ground may include a relative (or reference) ground, for example in a floating configuration. Ground conductor 128 functions to provide a grounding or earthing path, for example, for any abnormal, excess or stray electricity or electrical flow.

Still referring to FIG. 1, in an embodiment, connector 108 may include control pilot 120 configured to conduct one or more control signal(s) 172. In an embodiment, current conductor(s) 116 and control pilot(s) 120 may be included and/or incorporated in a single element, unit or conductor which conducts both current and signals. Control pilot may also be interchangeably referred to as control signal conductor in the present disclosure. In an embodiment, control pilot 120 may control a variable charging (e.g. voltage and/or current) rate to be supplied to energy source 156 and/or battery 152.

With continued reference to FIG. 1, in some embodiments, control pilot 120 is configured to conduct control signal(s) 172. As used in this disclosure, a "control pilot" or "control signal conductor" is a conductor configured to carry a control signal between an electric vehicle (e.g. electric aircraft 136) and a charger (e.g. connector 108). As used in this disclosure, a "control signal" is an electrical signal that is indicative of information. As also noted above, in this disclosure, control pilot may be used interchangeably with control signal conductor. In some cases, and without limitation, control signal 172 may include an analog signal or a digital signal. In some embodiments, control signal 172 may be communicated from one or more aircraft sensor(s) 160, including sensors configured to detect characteristics of battery 152 and/or energy source 156, and/or one or more connector sensor(s) 164. This control signal may then be provided to one or more controllers (or computing devices) such as controller 104 and/or a controller of aircraft 136 (e.g. flight controller 124). In some embodiments, control signal 172 may include a voltage signal or voltage datum of a battery of electric aircraft. Control signal 172 may also include one or more signals communicated from connector 108 and/or controller 104 to electric aircraft 136.

Still referring to FIG. 1, in some embodiments, control pilot 120 may be communicatively connected to a controller, computing device and/or aircraft. This may include, without limitation, communicative connection with controller 104, flight controller 124, remote controller 184, sensor(s) 164 and aircraft sensor(s) 160, among others. In an embodiment, control pilot 120 may be included in and/or incorporated with controller 104, or vice versa. Certain features of control pilots, control signal conductors, control signals and/or associated components and devices, which may efficaciously be utilized in accordance with certain embodiments of the present disclosure are disclosed in U.S. Nonprovisional application Ser. No. 17/405,840, filed on Aug. 18, 2021, entitled"CONNECTOR AND METHODS OF USE FOR CHARGING AN ELECTRIC VEHICLE".

With continued reference to FIG. 1, connector 108 may include a proximity signal conductor or proximity pilot. As used in this disclosure, an "proximity signal conductor" is a conductor configured to carry a proximity signal. As used in this disclosure, a "proximity signal" is a signal that is indicative of information about a location of connector. Proximity signal may be indicative of attachment of connector with a port, for instance an electric vehicle port and/or a test port. In some cases, a proximity signal may include an analog signal, a digital signal, an electrical signal, an optical signal, a fluidic signal, or the like. In some cases, a proximity signal conductor may be configured to conduct a proximity signal indicative of attachment between connector 108 and a port, for example electric aircraft port 132.

Still referring to FIG. 1, in some cases, system 100 and/or connector 108 may additionally include a proximity sensor. Proximity sensor may be electrically communicative with a proximity signal conductor. Proximity sensor may be configured to generate a proximity signal as a function of connection between connector 108 and a port, for example electric vehicle port 112. As used in this disclosure, a "proximity sensor" is a sensor that is configured to detect at least a phenomenon related to connecter being mated to a port. Proximity sensor may include any sensor described in this disclosure, including without limitation a switch, a capacitive sensor, a capacitive displacement sensor, a doppler effect sensor, an inductive sensor, a magnetic sensor, an optical sensor (such as without limitation a photoelectric sensor, a photocell, a laser rangefinder, a passive charge-coupled device, a passive thermal infrared sensor, and the like), a radar sensor, a reflection sensor, a sonar sensor, an ultrasonic sensor, fiber optics sensor, a Hall effect sensor, and the like. Certain features of proximity signal conductors, proximity sensors and/or associated components and devices, which may efficaciously be utilized in accordance with certain embodiments of the present disclosure are disclosed in U.S. Nonprovisional application Ser. No. 17/405,840, filed on Aug. 18, 2021, entitled "CONNECTOR AND METHODS OF USE FOR CHARGING AN ELECTRIC VEHICLE".

Still referring to FIG. 1, connector 108 may include multiple interfaces required for fast charging of electric vehicles including electric aircrafts. In an embodiment, connector 108 may include a coolant flow path, or a distal end thereof, configured to contain a flow of a coolant. For example, and without limitation, connector 108 may include a coolant interface to deliver coolant to at least a battery 152 of electric vehicle or aircraft 136 during charging or recharging. Connector 108 may include cooling of power contacts and/or cables within connector to prevent overheating of those elements during recharging as well. Coolant flow path may be in fluidic communication with a coolant source. As used in this disclosure, a "coolant source" is an origin, generator, reservoir, or flow producer of coolant. In some cases, coolant source may include a flow producer, such as a fan and/or a pump. Coolant source may include any of following non-limiting examples, air conditioner, refrigerator, heat exchanger, pump, fan, expansion valve, and the like.

Still referring to FIG. 1, as used in this disclosure, "coolant" is any flowable heat transfer medium. Coolant may include a liquid, a gas, a solid, and/or a fluid. Coolant may include a compressible fluid and/or a non-compressible fluid. Coolant may include a non-electrically conductive liquid such as a fluorocarbon-based fluid, such as without limitation Fluorinert™ from 3M of Saint Paul, Minn., USA. In some cases, coolant may include air. As used in this disclosure, a "flow of coolant" is a stream of coolant. In some cases, coolant may include a fluid and coolant flow is a fluid flow. Alternatively or additionally, in some cases, coolant may include a solid (e.g., bulk material) and coolant flow may include motion of the solid. Exemplary forms of mechanical motion for bulk materials include fluidized flow, augers, conveyors, slumping, sliding, rolling, and the like. Connectors and associated features of certain cooling embodiments are disclosed in U.S. Nonprovisional application Ser. No. 17/405,840, filed on Aug. 18, 2021, entitled "CONNECTOR AND METHODS OF USE FOR CHARGING AN ELECTRIC VEHICLE".

Still referring to FIG. 1, housing 112 may house or contain at least a portion of current conductor(s) 116, control pilot(s) 120, ground conductor(s) 128 and/or other components of connector 108 and/or system 100. Housing 112 may house or contain protection circuit 176, controller 104 and/or other components of connector 108 and/or system 100.

Still referring to FIG. 1, in some embodiments, one or more sensors communicatively connected to energy source 156 and/or battery 152 may provide or transmit data and/or signals to connector 108, controller 104 and/or remote controller 184. One or more sensors may also be used to detect state of charge (SOC) of energy source 156 and/or battery 152 and provide this information to connector 108, controller 104 and/or remote controller 184. Such information may be used to determine an appropriate and/or optimized charging voltage 148 and/or charging current 168 to be provided. Energy source 156 may include, without limitation, one or more battery packs, battery modules, battery units, batteries, battery cells, cells, or the like, as needed or desired, which may efficaciously be located at different locations on aircraft 136.

With continued reference to FIG. 1, as used in this disclosure, an "energy source" is a source (or supplier) of energy (or power) to power one or more components. For example, and without limitation, energy source may be configured provide energy to an aircraft power source that in turn that drives and/or controls any other aircraft component such as other flight components. An energy source may include, for example, an electrical energy source a generator, a photovoltaic device, a fuel cell such as a hydrogen fuel cell, direct methanol fuel cell, and/or solid oxide fuel cell, an electric energy storage device (e.g., a capacitor, an inductor, and/or a battery). An electrical energy source may also include a battery cell, a battery pack, or a plurality of battery cells connected in series into a module and each module connected in series or in parallel with other modules. Configuration of an energy source containing connected modules may be designed to meet an energy or power requirement and may be designed to fit within a designated footprint in an electric aircraft.

In an embodiment, and still referring to FIG. 1, an energy source may be used to provide a steady supply of electrical flow or power to a load over the course of a flight by a vehicle or other electric aircraft. For example, an energy source may be capable of providing sufficient power for "cruising" and other relatively low-energy phases of flight. An energy source may also be capable of providing electrical power for some higher-power phases of flight as well, particularly when the energy source is at a high state of charge (SOC), as may be the case for instance during takeoff. In an embodiment, an energy source may be capable of providing sufficient electrical power for auxiliary loads including without limitation, lighting, navigation, communications, de-icing, steering or other systems requiring power or energy. Further, an energy source may be capable of providing sufficient power for controlled descent and landing protocols, including, without limitation, hovering descent or runway landing. As used herein an energy source may have high power density where electrical power an energy source can usefully produce per unit of volume and/or mass is relatively high. "Electrical power," as used in this disclosure, is defined as a rate of electrical energy per unit time. An energy source may include a device for which power that may be produced per unit of volume and/or mass has been optimized, at the expense of the maximal total specific energy density or power capacity, during design. Non-limiting examples of items that may be used as at least an energy source may include batteries used for starting applications including Lithium ion (Li-ion) batteries which may include NCA, NMC, Lithium iron phosphate (LiFePO4) and Lithium Manganese Oxide (LMO) batteries, which may be mixed with another cathode chemistry to provide more specific power if the application requires Li metal batteries, which have a lithium metal anode that provides high power on demand, Li ion batteries that have a silicon or titanite anode, energy source may be used, in an embodiment, to provide electrical power to an electric aircraft or drone, such as an electric aircraft vehicle, during moments requiring high rates of power output, including without limitation takeoff, landing, thermal de-icing and situations requiring greater power output for reasons of stability, such as high turbulence situations, as described in further detail below. A battery may include, without limitation a battery using nickel based chemistries such as nickel cadmium or nickel metal hydride, a battery using lithium ion battery chemistries such as a nickel cobalt aluminum (NCA), nickel manganese cobalt (NMC), lithium iron phosphate (LiFePO4), lithium cobalt oxide (LCO), and/or lithium manganese oxide (LMO), a battery using lithium polymer technology, lead-based batteries such as without limitation lead acid batteries, metal-air batteries, or any other suitable battery. Persons skilled in the art, upon reviewing the entirety of this disclosure, will be aware of various devices of components that may be used as an energy source.

Still referring to FIG. 1, an energy source may include a plurality of energy sources, referred to herein as a module of energy sources. A module may include batteries connected in parallel or in series or a plurality of modules connected either in series or in parallel designed to deliver both the power and energy requirements of the application. Connecting batteries in series may increase the voltage of at least an energy source which may provide more power on demand. High voltage batteries may require cell matching when high peak load is needed. As more cells are connected in strings, there may exist the possibility of one cell failing which may increase resistance in the module and reduce an overall power output as a voltage of the module may decrease as a result of that failing cell. Connecting batteries in parallel may increase total current capacity by decreasing total resistance, and it also may increase overall amp-hour capacity. Overall energy and power outputs of at least an energy source may be based on individual battery cell performance or an extrapolation based on measurement of at least an electrical parameter. In an embodiment where an energy source includes a plurality of battery cells, overall power output capacity may be dependent on electrical parameters of each individual cell. If one cell experiences high self-discharge during demand, power drawn from at least an energy source may be decreased to avoid damage to the weakest cell. An energy source may further include, without limitation, wiring, conduit, housing, cooling system and battery management system. Persons skilled in the art will be aware, after reviewing the entirety of this disclosure, of many different components of an energy source.

Continuing to refer to FIG. 1, energy sources, battery packs, batteries, sensors, sensor suites and/or associated methods which may efficaciously be utilized in accordance with some embodiments are disclosed in U.S. Nonprovisional application Ser. No. 17/111,002, filed on Dec. 3, 2020, entitled "SYSTEMS AND METHODS FOR A BATTERY MANAGEMENT SYSTEM INTEGRATED IN A BATTERY PACK CONFIGURED FOR USE IN ELECTRIC AIRCRAFT," U.S. Nonprovisional application Ser. No. 17/108,798, filed on Dec. 1, 2020, and entitled "SYSTEMS AND METHODS FOR A BATTERY MANAGEMENT SYSTEM INTEGRATED IN A BATTERY PACK CONFIGURED FOR USE IN ELECTRIC AIRCRAFT," and U.S. Nonprovisional application Ser. No. 17/320,329, filed on May 14, 2021, and entitled "SYSTEMS AND METHODS FOR MONITORING HEALTH OF AN ELECTRIC VERTICAL TAKE-OFF AND LANDING VEHICLE," the entirety of each one of which is incorporated herein by reference.

With continued reference to FIG. 1, other energy sources, battery packs, batteries, sensors, sensor suites and/or associated methods which may efficaciously be utilized in accordance with some embodiments are disclosed in U.S. Nonprovisional application Ser. No. 16/590,496, filed on Oct. 2, 2019, and entitled "SYSTEMS AND METHODS FOR RESTRICTING POWER TO A LOAD TO PREVENT ENGAGING CIRCUIT PROTECTION DEVICE FOR AN AIRCRAFT," U.S. Nonprovisional application Ser. No. 17/348,137, filed on Jun. 15, 2021, and entitled "SYSTEMS AND METHODS FOR RESTRICTING POWER TO A LOAD TO PREVENT ENGAGING CIRCUIT PROTECTION DEVICE FOR AN AIRCRAFT," U.S. Nonprovisional application Ser. No. 17/008,721, filed on Sep. 1, 2020, and entitled "SYSTEM AND METHOD FOR SECURING BATTERY IN AIRCRAFT," U.S. Nonprovisional application Ser. No. 16/948,157, filed on Sep. 4, 2020, and entitled "SYSTEM AND METHOD FOR HIGH ENERGY DENSITY BATTERY MODULE," U.S. Nonprovisional application Ser. No. 16/948,140, filed on Sep. 4, 2020, and entitled "SYSTEM AND METHOD FOR HIGH ENERGY DENSITY BATTERY MODULE," and U.S. Nonprovisional application Ser. No. 16/948,141, filed on Sep. 4, 2020, and entitled "COOLING ASSEMBLY FOR USE IN A BATTERY MODULE ASSEMBLY," the entirety of each one of which is incorporated herein by reference. Still other energy sources, battery packs, batteries, sensors, sensor suites, charging connectors and/or associated methods which may efficaciously be utilized in accordance with some embodiments are disclosed in U.S. Nonprovisional application Ser. No. 17/405,840, filed on Aug. 18, 2021, entitled "CONNECTOR AND METHODS OF USE FOR CHARGING AN ELECTRIC VEHICLE".

Still referring to FIG. 1, power supply 140 may be configured to provide an electrical flow or current to connector 108, controller 104 and/or remote controller 184. As used in this disclosure, a "power supply" is a source that supplies electrical power, for example for charging a battery. In some cases, power supply 140 may include a charging battery (i.e., a battery used for charging other batteries). A charging battery is notably contrasted with an electric vehicle or electric aircraft battery, which is located for example upon an electric aircraft. Charging battery of power supply 140 may include a plurality of batteries, battery modules, and/or battery cells. Charging battery of power supply may be configured to store a range of electrical energy, for example a range of between about 5 KWh and about 5,000 KWh. Power supply 140 may house a variety of electrical components. In one embodiment, power supply 140 may contain a solar inverter. Solar inverter may be configured to produce on-site power generation. In one embodiment, power generated from solar inverter may be stored in a charging battery. In some embodiments, charging battery of power supply may include a used electric vehicle battery no longer fit for service in a vehicle. Charging battery of power supply may include any battery described in this disclosure.

In some embodiments, and still referring to FIG. 1, power supply 140 may have a continuous power rating of at least 350 kVA. In other embodiments, power supply 140 may have a continuous power rating of over 350 kVA. In some embodiments, power supply 140 may have a battery charge range up to 950 Vdc. In other embodiments, power supply 140 may have a battery charge range of over 950 Vdc. In some embodiments, power supply 140 may have a continuous charge current of at least 350 amps. In other embodiments, power supply 140 may have a continuous charge current of over 350 amps. In some embodiments, power supply 140 may have a boost charge current of at least 500 amps. In other embodiments, power supply 140 may have a boost charge current of over 500 amps. In some embodiments, power supply 140 may include any component with the capability of recharging an energy source of an electric vehicle or aircraft. In some embodiments, power supply 140 may include a constant voltage charger, a constant current charger, a taper current charger, a pulsed current charger, a negative pulse charger, an IUI charger, a trickle charger, and a float charger.

With continued reference to FIG. 1, in some cases, power supply 140 may include one or electrical components configured to control flow of an electric recharging current or switches, relays, direct current to direct current (DC-DC) converters, and the like. In some cases, power supply 140 may include one or more circuits configured to provide a variable current source to provide electric recharging current, for example an active current source. Non-limiting examples of active current sources include active current sources without negative feedback, such as current-stable nonlinear implementation circuits, following voltage implementation circuits, voltage compensation implementation circuits, and current compensation implementation circuits, and current sources with negative feedback, including simple transistor current sources, such as constant currant diodes, Zener diode current source circuits, LED current source circuits, transistor current, and the like, Op-amp current source circuits, voltage regulator circuits, and curpistor tubes, to name a few. In some cases, one or more circuits within power supply 140 or within communication with supply 140 may be configured to affect electrical recharging current according to a control signal from a controller (e.g. controller 104, remote controller 184), such that the controller may control at least a parameter of electrical charging current or voltage. For example, in some cases, controller may control one or more of current (Amps), potential (Volts), and/or power (Watts) of electrical charging current or voltage by way of control signal. In some cases, controller may be configured to selectively engage electrical charging current or voltage, for example ON or OFF by way of a control signal.

Still referring to FIG. 1, in some cases, an AC-DC converter may be used to recharge a charging battery of power supply 140. In some cases, AC-DC converter may be used to provide electrical power to power supply 140. In some embodiments, power supply 140 may have a connection to a grid power component. Grid power component may be connected to an external electrical power grid. In some embodiments, grid power component may be configured to slowly charge one or more batteries (e.g. of power supply 140) in order to reduce strain on nearby electrical power grids. In one embodiment, grid power component may have an AC grid current of at least 450 amps. In some embodiments, grid power component may have an AC grid current of more or less than 450 amps. In one embodiment, grid power component may have an AC voltage connection of 480 Vac. In other embodiments, grid power component may have an AC voltage connection of above or below 480 Vac. In some embodiments, power source 140 may provide power to the grid power component. In this configuration, power source 140 may provide power to a surrounding electrical power grid. Certain features including structure and electronic configuration of charging stations and power supplies (sources) which may efficaciously be used in conjunction with some embodiments of the present disclosure are disclosed in U.S. Nonprovisional application Ser. No. 17/405,840, filed on Aug. 18, 2021, entitled "CONNECTOR AND METHODS OF USE FOR CHARGING AN ELECTRIC VEHICLE".

Exemplary embodiments may be further understood without limitation, with reference to the table below.

| | Min. | Max. | Nom. |
|---|---|---|---|
| Electrical charging current power (AC) | 1 KW | 200 KW | 20 KW |
| Electrical charging current (AC) | 10 Amps | 450 Amps | 80 Amps |
| Electrical charging current power (DC) | 1 KW | 250 KW | 25 KW |
| Electrical charging current (DC) | 10 Amps | 500 Amps | 50 Amps |
| Battery acceptable temperature change during charging | −30° C. | +50° C. | 0° C. |
| Conductor acceptable temperature change during charging | −30° C. | +50° C. | 0° C. |
| Coolant | Air, water, water-glycol mix, anti-freeze, Fluorinert ™, ethylene glycol, propylene glycol, any combination thereof, and the like. | | |
| Connector-Port mating sequence | Mated First: coolant flow source, proximity contact, isolation monitor contacts. Mated Last: AC conductor, DC conductor, control signal. | | |
| Conductor materials | Copper, copper-alloys, noble metals, non-noble metals, carbon, diamond, graphite, platinum group metals, and the like. | | |
| Conductor coatings | Copper, copper-alloys, noble metals, non-noble metals, carbon, diamond, graphite, hard gold, hard gold flashed palladium-nickel (e.g., 80/20), tin, silver, diamond-like carbon, platinum-group metals, and the like. | | |

Referring now to FIG. 2, an exemplary embodiment of an electric aircraft 200 which may be used in conjunction with a connector (e.g. connector 108 of FIG. 1) and/or system (e.g. system 100 of FIG. 1), with overvoltage protection, for charging an electric aircraft is illustrated. Electric aircraft 200, and any of its features, may be used in conjunction with any of the embodiments of the present disclosure. Electric aircraft 200 may include any of the aircrafts as disclosed herein including electric aircraft 136 of FIG. 1. In an embodiment, electric aircraft 200 may be an electric vertical takeoff and landing (eVTOL) aircraft. As used in this disclosure, an "aircraft" is any vehicle that may fly by gaining support from the air. As a non-limiting example, aircraft may include airplanes, helicopters, commercial, personal and/or recreational aircrafts, instrument flight aircrafts, drones, electric aircrafts, airliners, rotorcrafts, vertical takeoff and landing aircrafts, jets, airships, blimps, gliders, paramotors, quad-copters, unmanned aerial vehicles (UAVs) and the like. As used in this disclosure, an "electric aircraft" is an electrically powered aircraft such as one powered by one or more electric motors or the like. In some embodiments, electrically powered (or electric) aircraft may be an electric vertical takeoff and landing (eVTOL) aircraft. Electric aircraft may be capable of rotor-based cruising flight, rotor-based takeoff, rotor-based landing, fixed-wing cruising flight, airplane-style takeoff, airplane-style landing, and/or any combination thereof. Electric aircraft may include one or more manned and/or unmanned aircrafts. Electric aircraft may include one or more all-electric short takeoff and landing (eSTOL) aircrafts. For example, and without limitation, eSTOL aircrafts may accelerate the plane to a flight speed on takeoff and decelerate the plane after landing. In an embodiment, and without limitation, electric aircraft may be configured with an electric propulsion assembly. Including one or more propulsion and/or flight components. Electric propulsion assembly may include any electric propulsion assembly (or system) as described in U.S. Nonprovisional application Ser. No. 16/703,225, filed on Dec. 4, 2019, and entitled "AN INTEGRATED ELECTRIC PROPULSION ASSEMBLY," the entirety of which is incorporated herein by reference.

Still referring to FIG. 2, as used in this disclosure, a "vertical take-off and landing (VTOL) aircraft" is one that can hover, take off, and land vertically. An "electric vertical takeoff and landing aircraft" or "eVTOL aircraft", as used in this disclosure, is an electrically powered aircraft typically using an energy source, of a plurality of energy sources to power the aircraft. In order to optimize the power and energy necessary to propel the aircraft, eVTOL may be capable of rotor-based cruising flight, rotor-based takeoff, rotor-based landing, fixed-wing cruising flight, airplane-style takeoff, airplane style landing, and/or any combination thereof. Rotor-based flight, as described herein, is where the aircraft generates lift and propulsion by way of one or more powered rotors or blades coupled with an engine, such as a "quad copter," multi-rotor helicopter, or other vehicle that maintains its lift primarily using downward thrusting propulsors. "Fixed-wing flight", as described herein, is where the aircraft is capable of flight using wings and/or foils that generate lift caused by the aircraft's forward airspeed and the shape of the wings and/or foils, such as airplane-style flight.

Still referring to FIG. 2, electric aircraft 200, in some embodiments, may generally include a fuselage 204, a flight component 208 (or a plurality of flight components 208), a pilot control 220, an aircraft sensor 228 (or a plurality of aircraft sensors 228) and flight controller 124. In one embodiment, flight components 208 may include at least a lift component 212 (or a plurality of lift components 212) and at least a pusher component 216 (or a plurality of pusher components 216). Aircraft sensor(s) 228 may be the same as or similar to aircraft sensor(s) 160 of FIG. 1.

Still referring to FIG. 2, as used in this disclosure a "fuselage" is the main body of an aircraft, or in other words, the entirety of the aircraft except for the cockpit, nose, wings, empennage, nacelles, any and all control surfaces, and generally contains an aircraft's payload. Fuselage 204 may include structural elements that physically support a shape and structure of an aircraft. Structural elements may take a plurality of forms, alone or in combination with other types. Structural elements may vary depending on a construction type of aircraft such as without limitation a fuselage 204. Fuselage 204 may comprise a truss structure. A truss structure may be used with a lightweight aircraft and comprises welded steel tube trusses. A "truss," as used in this disclosure, is an assembly of beams that create a rigid structure, often in combinations of triangles to create three-dimensional shapes. A truss structure may alternatively comprise wood construction in place of steel tubes, or a combination thereof. In embodiments, structural elements may comprise steel tubes and/or wood beams. In an embodiment, and without limitation, structural elements may include an aircraft skin. Aircraft skin may be layered over the body shape constructed by trusses. Aircraft skin may comprise a plurality of materials such as plywood sheets, aluminum, fiberglass, and/or carbon fiber.

Still referring to FIG. 2, it should be noted that an illustrative embodiment is presented only, and this disclosure in no way limits the form or construction method of any of the aircrafts as disclosed herein. In embodiments, fuselage 204 may be configurable based on the needs of the aircraft per specific mission or objective. The general arrangement of components, structural elements, and hardware associated with storing and/or moving a payload may be added or removed from fuselage 204 as needed, whether it is stowed manually, automatedly, or removed by personnel altogether. Fuselage 204 may be configurable for a plurality of storage options. Bulkheads and dividers may be installed and uninstalled as needed, as well as longitudinal dividers where necessary. Bulkheads and dividers may be installed using integrated slots and hooks, tabs, boss and channel, or hardware like bolts, nuts, screws, nails, clips, pins, and/or dowels, to name a few. Fuselage 204 may also be configurable to accept certain specific cargo containers, or a receptable that can, in turn, accept certain cargo containers.

Still referring to FIG. 2, electric aircraft 200 may include a plurality of laterally extending elements attached to fuselage 204. As used in this disclosure a "laterally extending element" is an element that projects essentially horizontally from fuselage, including an outrigger, a spar, and/or a fixed wing that extends from fuselage. Wings may be structures which include airfoils configured to create a pressure differential resulting in lift. Wings may generally dispose on the left and right sides of the aircraft symmetrically, at a point between nose and empennage. Wings may comprise a plurality of geometries in planform view, swept swing, tapered, variable wing, triangular, oblong, elliptical, square, among others. A wing's cross section geometry may comprise an airfoil. An "airfoil" as used in this disclosure is a shape specifically designed such that a fluid flowing above and below it exert differing levels of pressure against the top and bottom surface. In embodiments, the bottom surface of an aircraft can be configured to generate a greater pressure than does the top, resulting in lift. Laterally extending element may comprise differing and/or similar cross-sectional geometries over its cord length or the length from wing tip to where wing meets the aircraft's body. One or more wings may be symmetrical about the aircraft's longitudinal plane, which comprises the longitudinal or roll axis reaching down the center of the aircraft through the nose and empennage, and the plane's yaw axis. Laterally extending element may comprise controls surfaces configured to be commanded by a pilot or pilots to change a wing's geometry and therefore its interaction with a fluid medium, like air. Control surfaces may comprise flaps, ailerons, tabs, spoilers, and slats, among others. The control surfaces may dispose on the wings in a plurality of locations and arrangements and in embodiments may be disposed at the leading and trailing edges of the wings, and may be configured to deflect up, down, forward, aft, or a combination thereof. An aircraft, including a dual-mode aircraft may comprise a combination of control surfaces to perform maneuvers while flying or on ground. In some embodiments, winglets may be provided at terminal ends of the wings which can provide improved aerodynamic efficiency and stability in certain flight situations. In some embodiments, the wings may be foldable to provide a compact aircraft profile, for example, for storage, parking and/or in certain flight modes.

Still referring to FIG. 2, electric aircraft 200 may include a plurality of flight components 208. As used in this disclosure a "flight component" is a component that promotes flight and guidance of an aircraft. Flight component 208 may include power sources, control links to one or more elements, fuses, and/or mechanical couplings used to drive and/or control any other flight component. Flight component 208 may include a motor that operates to move one or more flight control components, to drive one or more propulsors, or the like. A motor may be driven by direct current (DC) electric power and may include, without limitation, brushless DC electric motors, switched reluctance motors, induction motors, or any combination thereof. A motor may also include electronic speed controllers or other components for regulating motor speed, rotation direction, and/or dynamic braking. Flight component 208 may include an energy source. An energy source may include, for example, a generator, a photovoltaic device, a fuel cell such as a hydrogen fuel cell, direct methanol fuel cell, and/or solid oxide fuel cell, an electric energy storage device (e.g. a capacitor, an inductor, and/or a battery). An energy source may also include a battery cell, or a plurality of battery cells connected in series into a module and each module connected in series or in parallel with other modules. Configuration of an energy source containing connected modules may be designed to meet an energy or power requirement and may be designed to fit within a designated footprint in an electric aircraft.

Still referring to FIG. 2, in an embodiment, flight component 208 may be mechanically coupled to an aircraft. As used herein, a person of ordinary skill in the art would understand "mechanically coupled" to mean that at least a portion of a device, component, or circuit is connected to at least a portion of the aircraft via a mechanical coupling. Said mechanical coupling can include, for example, rigid coupling, such as beam coupling, bellows coupling, bushed pin coupling, constant velocity, split-muff coupling, diaphragm coupling, disc coupling, donut coupling, elastic coupling, flexible coupling, fluid coupling, gear coupling, grid coupling, hirth joints, hydrodynamic coupling, jaw coupling, magnetic coupling, Oldham coupling, sleeve coupling, tapered shaft lock, twin spring coupling, rag joint coupling, universal joints, or any combination thereof. In an embodiment, mechanical coupling may be used to connect the ends of adjacent parts and/or objects of an electric aircraft. Further, in an embodiment, mechanical coupling may be used to join two pieces of rotating electric aircraft components.

Still referring to FIG. 2, in an embodiment, plurality of flight components 208 of aircraft 200 may include at least a lift component 212 and at least a pusher component 216. Flight component 208 may include a propulsor, a propeller, a motor, rotor, a rotating element, electrical energy source, battery, and the like, among others. Each flight component may be configured to generate lift and flight of electric aircraft. In some embodiments, flight component 208 may include one or more lift components 212, one or more pusher components 216, one or more battery packs including one or more batteries or cells, and one or more electric motors. Flight component 208 may include a propulsor. As used in this disclosure a "propulsor component" or "propulsor" is a component and/or device used to propel a craft by exerting force on a fluid medium, which may include a gaseous medium such as air or a liquid medium such as water. In an embodiment, when a propulsor twists and pulls air behind it, it may, at the same time, push an aircraft forward with an amount of force and/or thrust. More air pulled behind an aircraft results in greater thrust with which the aircraft is pushed forward. Propulsor component may include any device or component that consumes electrical power on demand to propel an electric aircraft in a direction or other vehicle while on ground or in-flight.

Still referring to FIG. 2, in some embodiments, lift component 212 may include a propulsor, a propeller, a blade, a motor, a rotor, a rotating element, an aileron, a rudder, arrangements thereof, combinations thereof, and the like. Each lift component 212, when a plurality is present, of plurality of flight components 208 is configured to produce, in an embodiment, substantially upward and/or vertical thrust such that aircraft moves upward.

With continued reference to FIG. 2, as used in this disclosure a "lift component" is a component and/or device used to propel a craft upward by exerting downward force on a fluid medium, which may include a gaseous medium such as air or a liquid medium such as water. Lift component 212 may include any device or component that consumes electrical power on demand to propel an electric aircraft in a direction or other vehicle while on ground or in-flight. For example, and without limitation, lift component 212 may include a rotor, propeller, paddle wheel and the like thereof, wherein a rotor is a component that produces torque along the longitudinal axis, and a propeller produces torque along the vertical axis. In an embodiment, lift component 212 includes a plurality of blades. As used in this disclosure a "blade" is a propeller that converts rotary motion from an engine or other power source into a swirling slipstream. In an embodiment, blade may convert rotary motion to push the propeller forwards or backwards. In an embodiment lift component 212 may include a rotating power-driven hub, to which are attached several radial airfoil-section blades such that the whole assembly rotates about a longitudinal axis. Blades may be configured at an angle of attack. In an embodiment, and without limitation, angle of attack may include a fixed angle of attack. As used in this disclosure a "fixed angle of attack" is fixed angle between a chord line of a blade and relative wind. As used in this disclosure a "fixed angle" is an angle that is secured and/or unmovable from the attachment point. In an embodiment, and without limitation, angle of attack may include a variable angle of attack. As used in this disclosure a "variable angle of attack" is a variable and/or moveable angle between a chord line of a blade and relative wind. As used in this disclosure a "variable angle" is an angle that is moveable from an attachment point. In an embodiment, angle of attack be configured to produce a fixed pitch angle. As used in this disclosure a "fixed pitch angle" is a fixed angle between a cord line of a blade and the rotational velocity direction. In an embodiment fixed angle of attack may be manually variable to a few set positions to adjust one or more lifts of the aircraft prior to flight. In an embodiment, blades for an aircraft are designed to be fixed to their hub at an angle similar to the thread on a screw makes an angle to the shaft; this angle may be referred to as a pitch or pitch angle which will determine a speed of forward movement as the blade rotates.

In an embodiment, and still referring to FIG. 2, lift component 212 may be configured to produce a lift. As used in this disclosure a "lift" is a perpendicular force to the oncoming flow direction of fluid surrounding the surface. For example, and without limitation relative air speed may be horizontal to the aircraft, wherein lift force may be a force exerted in a vertical direction, directing the aircraft upwards. In an embodiment, and without limitation, lift component 212 may produce lift as a function of applying a torque to lift component. As used in this disclosure a "torque" is a measure of force that causes an object to rotate about an axis in a direction. For example, and without limitation, torque may rotate an aileron and/or rudder to generate a force that may adjust and/or affect altitude, airspeed velocity, groundspeed velocity, direction during flight, and/or thrust. For example, one or more flight components 208 such as a power source(s) may apply a torque on lift component 212 to produce lift.

In an embodiment and still referring to FIG. 2, a plurality of lift components 212 of plurality of flight components 208 may be arranged in a quad copter orientation. As used in this disclosure a "quad copter orientation" is at least a lift component oriented in a geometric shape and/or pattern, wherein each of the lift components is located along a vertex of the geometric shape. For example, and without limitation, a square quad copter orientation may have four lift propulsor components oriented in the geometric shape of a square, wherein each of the four lift propulsor components are located along the four vertices of the square shape. As a further non-limiting example, a hexagonal quad copter orientation may have six lift components oriented in the geometric shape of a hexagon, wherein each of the six lift components are located along the six vertices of the hexagon shape. In an embodiment, and without limitation, quad copter orientation may include a first set of lift components and a second set of lift components, wherein the first set of lift components and the second set of lift components may include two lift components each, wherein the first set of lift components and a second set of lift components are distinct from one another. For example, and without limitation, the first set of lift components may include two lift components that rotate in a clockwise direction, wherein the second set of lift propulsor components may include two lift components that rotate in a counterclockwise direction. In an embodiment, and without limitation, the first set of lift components may be oriented along a line oriented 45° from the longitudinal axis of aircraft 200. In another embodiment, and without limitation, the second set of lift components may be oriented along a line oriented 135° from the longitudinal axis, wherein the first set of lift components line and the second set of lift components are perpendicular to each other.

Still referring to FIG. 2, pusher component 216 and lift component 212 (of flight component(s) 208) may include any such components and related devices as disclosed in U.S. Nonprovisional application Ser. No. 16/427,298, filed on May 30, 2019, entitled "SELECTIVELY DEPLOYABLE HEATED PROPULSOR SYSTEM," U.S. Nonprovisional application Ser. No. 16/703,225, filed on Dec. 4, 2019, entitled "AN INTEGRATED ELECTRIC PROPULSION ASSEMBLY," U.S. Nonprovisional application Ser. No. 16/910,255, filed on Jun. 24, 2020, entitled "AN INTEGRATED ELECTRIC PROPULSION ASSEMBLY," U.S. Nonprovisional application. Ser. No. 17/319,155, filed on May 13, 2021, entitled "AIRCRAFT HAVING REVERSE THRUST CAPABILITIES," U.S. Nonprovisional application Ser. No. 16/929,206, filed on Jul. 15, 2020, entitled "A HOVER AND THRUST CONTROL ASSEMBLY FOR DUAL-MODE AIRCRAFT," U.S. Nonprovisional application Ser. No. 17/001,845, filed on Aug. 25, 2020, entitled "A HOVER AND THRUST CONTROL ASSEMBLY FOR DUAL-MODE AIRCRAFT," U.S. Nonprovisional application Ser. No. 17/186,079, filed on Feb. 26, 2021, entitled "METHODS AND SYSTEM FOR ESTIMATING PERCENTAGE TORQUE PRODUCED BY A PROPULSOR CONFIGURED FOR USE IN AN ELECTRIC AIRCRAFT," and U.S. Nonprovisional application Ser. No. 17/321,662, filed on May 17, 2021, entitled "AIRCRAFT FOR FIXED PITCH LIFT," the entirety of each one of which is incorporated herein by reference. Any aircrafts, including electric and eVTOL aircrafts, as disclosed in any of these applications may efficaciously be utilized with any of the embodiments as disclosed herein, as needed or desired. Any flight controllers as disclosed in any of these applications may efficaciously be utilized with any of the embodiments as disclosed herein, as needed or desired.

Still referring to FIG. 2, pusher component 216 may include a propulsor, a propeller, a blade, a motor, a rotor, a rotating element, an aileron, a rudder, arrangements thereof, combinations thereof, and the like. Each pusher component 216, when a plurality is present, of the plurality of flight components 208 is configured to produce, in an embodiment, substantially forward and/or horizontal thrust such that the aircraft moves forward.

Still referring to FIG. 2, as used in this disclosure a "pusher component" is a component that pushes and/or thrusts an aircraft through a medium. As a non-limiting example, pusher component 216 may include a pusher propeller, a paddle wheel, a pusher motor, a pusher propulsor, and the like. Additionally, or alternatively, pusher flight component may include a plurality of pusher flight components. Pusher component 216 is configured to produce a forward thrust. As a non-limiting example, forward thrust may include a force to force aircraft to in a horizontal direction along the longitudinal axis. As a further non-limiting example, pusher component 216 may twist and/or rotate to pull air behind it and, at the same time, push aircraft 200 forward with an equal amount of force. In an embodiment, and without limitation, the more air forced behind aircraft, the greater the thrust force with which the aircraft is pushed horizontally will be. In another embodiment, and without limitation, forward thrust may force aircraft 200 through the medium of relative air. Additionally or alternatively, plurality of flight components 208 may include one or more puller components. As used in this disclosure a "puller component" is a component that pulls and/or tows an aircraft through a medium. As a non-limiting example, puller component may include a flight component such as a puller propeller, a puller motor, a tractor propeller, a puller propulsor, and the like. Additionally, or alternatively, puller component may include a plurality of puller flight components.

Still referring to FIG. 2, as used in this disclosure a "power source" is a source that powers, drives and/or controls any flight component and/or other aircraft component. For example, and without limitation power source may include a motor that operates to move one or more lift components 212 and/or one or more pusher components 216, to drive one or more blades, or the like thereof. Motor(s) may be driven by direct current (DC) electric power and may include, without limitation, brushless DC electric motors, switched reluctance motors, induction motors, or any combination thereof. Motor(s) may also include electronic speed controllers or other components for regulating motor speed, rotation direction, and/or dynamic braking. A "motor" as used in this disclosure is any machine that converts non-mechanical energy into mechanical energy. An "electric motor" as used in this disclosure is any machine that converts electrical energy into mechanical energy.

Still referring to FIG. 2, in an embodiment, aircraft 200 may include a pilot control 220. As used in this disclosure, a "pilot control" is a mechanism or means which allows a pilot to monitor and control operation of aircraft such as its flight components (for example, and without limitation, pusher component, lift component and other components such as propulsion components). For example, and without limitation, pilot control 220 may include a collective, inceptor, foot bake, steering and/or control wheel, control stick, pedals, throttle levers, and the like. Pilot control 220 may be configured to translate a pilot's desired torque for each flight component of the plurality of flight components, such as and without limitation, pusher component 216 and lift component 212. Pilot control 220 may be configured to control, via inputs and/or signals such as from a pilot, the pitch, roll, and yaw of the aircraft. Pilot control may be available onboard aircraft or remotely located from it, as needed or desired.

Still referring to FIG. 2, as used in this disclosure a "collective control" or "collective" is a mechanical control of an aircraft that allows a pilot to adjust and/or control the pitch angle of plurality of flight components 208. For example and without limitation, collective control may alter and/or adjust the pitch angle of all of the main rotor blades collectively. For example, and without limitation pilot control 220 may include a yoke control. As used in this disclosure a "yoke control" is a mechanical control of an aircraft to control the pitch and/or roll. For example and without limitation, yoke control may alter and/or adjust the roll angle of aircraft 200 as a function of controlling and/or maneuvering ailerons. In an embodiment, pilot control 220 may include one or more foot-brakes, control sticks, pedals, throttle levels, and the like thereof. In another embodiment, and without limitation, pilot control 220 may be configured to control a principal axis of the aircraft. As used in this disclosure a "principal axis" is an axis in a body representing one three dimensional orientations. For example, and without limitation, principal axis or more yaw, pitch, and/or roll axis. Principal axis may include a yaw axis. As used in this disclosure a "yaw axis" is an axis that is directed towards the bottom of aircraft, perpendicular to the wings. For example, and without limitation, a positive yawing motion may include adjusting and/or shifting nose of aircraft 200 to the right. Principal axis may include a pitch axis. As used in this disclosure a "pitch axis" is an axis that is directed towards the right laterally extending wing of aircraft. For example, and without limitation, a positive pitching motion may include adjusting and/or shifting nose of aircraft 200 upwards. Principal axis may include a roll axis. As used in this disclosure a "roll axis" is an axis that is directed longitudinally towards nose of aircraft, parallel to fuselage. For example, and without limitation, a positive rolling motion may include lifting the left and lowering the right wing concurrently. Pilot control 220 may be configured to modify a variable pitch angle. For example, and without limitation, pilot control 220 may adjust one or more angles of attack of a propulsor or propeller.

Still referring to FIG. 2, aircraft 200 may include at least an aircraft sensor 228. Aircraft sensor 228 may include any sensor or noise monitoring circuit described in this disclosure. Aircraft sensor 228, in some embodiments, may be communicatively connected or coupled to flight controller 124. Aircraft sensor 228 may be configured to sense a characteristic of pilot control 220. Sensor may be a device, module, and/or subsystem, utilizing any hardware, software, and/or any combination thereof to sense a characteristic and/or changes thereof, in an instant environment, for instance without limitation a pilot control 220, which the sensor is proximal to or otherwise in a sensed communication with, and transmit information associated with the characteristic, for instance without limitation digitized data. Sensor 228 may be mechanically and/or communicatively coupled to aircraft 200, including, for instance, to at least a pilot control 220. Aircraft sensor 228 may be configured to sense a characteristic associated with at least a pilot control 220. An environmental sensor may include without limitation one or more sensors used to detect ambient temperature, barometric pressure, and/or air velocity. Aircraft sensor 228 may include without limitation gyroscopes, accelerometers, inertial measurement unit (IMU), and/or magnetic sensors, one or more humidity sensors, one or more oxygen sensors, or the like. Additionally or alternatively, sensor 228 may include at least a geospatial sensor. Aircraft sensor 228 may be located inside aircraft, and/or be included in and/or attached to at least a portion of aircraft. Sensor may include one or more proximity sensors, displacement sensors, vibration sensors, and the like thereof. Sensor may be used to monitor the status of aircraft 200 for both critical and non-critical functions. Sensor may be incorporated into vehicle or aircraft or be remote.

Still referring to FIG. 2, in some embodiments, aircraft sensor 228 may be configured to sense a characteristic associated with any pilot control described in this disclosure. Non-limiting examples of aircraft sensor 228 may include an inertial measurement unit (IMU), an accelerometer, a gyroscope, a proximity sensor, a pressure sensor, a light sensor, a pitot tube, an air speed sensor, a position sensor, a speed sensor, a switch, a thermometer, a strain gauge, an acoustic sensor, and an electrical sensor. In some cases, aircraft sensor 228 may sense a characteristic as an analog measurement, for instance, yielding a continuously variable electrical potential indicative of the sensed characteristic. In these cases, aircraft sensor 228 may additionally comprise an analog to digital converter (ADC) as well as any additionally circuitry, such as without limitation a Wheatstone bridge, an amplifier, a filter, and the like. For instance, in some cases, aircraft sensor 228 may comprise a strain gage configured to determine loading of one or more aircraft components, for instance landing gear. Strain gage may be included within a circuit comprising a Wheatstone bridge, an amplified, and a bandpass filter to provide an analog strain measurement signal having a high signal to noise ratio, which characterizes strain on a landing gear member. An ADC may then digitize analog signal produces a digital signal that can then be transmitted other systems within aircraft 200, for instance without limitation a computing system, a pilot display, and a memory component. Alternatively or additionally, aircraft sensor 228 may sense a characteristic of a pilot control 220 digitally. For instance in some embodiments, aircraft sensor 228 may sense a characteristic through a digital means or digitize a sensed signal natively. In some cases, for example, aircraft sensor 228 may include a rotational encoder and be configured to sense a rotational position of a pilot control; in this case, the rotational encoder digitally may sense rotational "clicks" by any known method, such as without limitation magnetically, optically, and the like. Aircraft sensor 228 may include any of the sensors as disclosed in the present disclosure. Aircraft sensor 228 may include a plurality of sensors. Any of these sensors may be located at any suitable position in or on aircraft 200.

Figure 3:
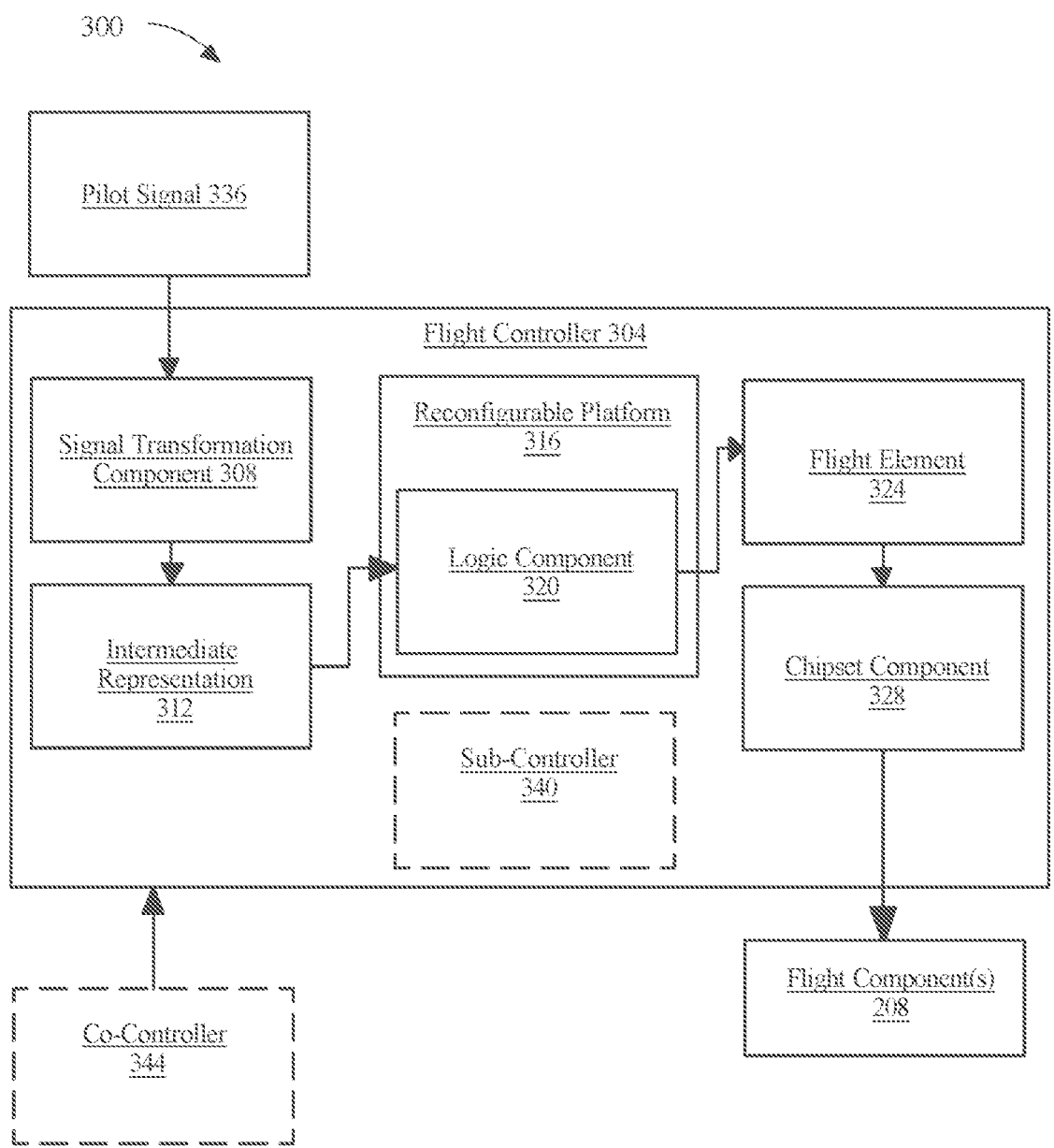
FIG. 3 is a block diagram of an exemplary embodiment of a flight controller.

With continued reference to FIG. 2, in some embodiments, electric aircraft 200 includes, or may be coupled to or communicatively connected to, flight controller 124 which is described further with reference to FIG. 3. As used in this disclosure a "flight controller" is a computing device of a plurality of computing devices dedicated to data storage, security, distribution of traffic for load balancing, and flight instruction. In embodiments, flight controller may be installed in an aircraft, may control the aircraft remotely, and/or may include an element installed in the aircraft and a remote element in communication therewith. Flight controller 124, in an embodiment, is located within fuselage 204 of aircraft. In accordance with some embodiments, flight controller is configured to operate a vertical lift flight (upwards or downwards, that is, takeoff or landing), a fixed wing flight (forward or backwards), a transition between a vertical lift flight and a fixed wing flight, and a combination of a vertical lift flight and a fixed wing flight.

Still referring to FIG. 2, in an embodiment, and without limitation, flight controller 124 may be configured to operate a fixed-wing flight capability. A "fixed-wing flight capability" can be a method of flight wherein the plurality of laterally extending elements generate lift. For example, and without limitation, fixed-wing flight capability may generate lift as a function of an airspeed of aircraft 200 and one or more airfoil shapes of the laterally extending elements. As a further non-limiting example, flight controller 124 may operate the fixed-wing flight capability as a function of reducing applied torque on lift (propulsor) component 212. In an embodiment, and without limitation, an amount of lift generation may be related to an amount of forward thrust generated to increase airspeed velocity, wherein the amount of lift generation may be directly proportional to the amount of forward thrust produced. Additionally or alternatively, flight controller may include an inertia compensator. As used in this disclosure an "inertia compensator" is one or more computing devices, electrical components, logic circuits, processors, and the like there of that are configured to compensate for inertia in one or more lift (propulsor) components present in aircraft 100. Inertia compensator may alternatively or additionally include any computing device used as an inertia compensator as described in U.S. Nonprovisional application Ser. No. 17/106,557, filed on Nov. 30, 2020, and entitled "SYSTEM AND METHOD FOR FLIGHT CONTROL IN ELECTRIC AIRCRAFT," the entirety of which is incorporated herein by reference. Flight controller 124 may efficaciously include any flight controllers as disclosed in U.S. Nonprovisional application Ser. No. 17/106,557, filed on Nov. 30, 2020, and entitled "SYSTEM AND METHOD FOR FLIGHT CONTROL IN ELECTRIC AIRCRAFT."

In an embodiment, and still referring to FIG. 2, flight controller 124 may be configured to perform a reverse thrust command. As used in this disclosure a "reverse thrust command" is a command to perform a thrust that forces a medium towards the relative air opposing aircraft 100. Reverse thrust command may alternatively or additionally include any reverse thrust command as described in U.S. Nonprovisional application Ser. No. 17/319,155, filed on May 13, 2021, and entitled "AIRCRAFT HAVING REVERSE THRUST CAPABILITIES," the entirety of which is incorporated herein by reference. In another embodiment, flight controller may be configured to perform a regenerative drag operation. As used in this disclosure a "regenerative drag operation" is an operating condition of an aircraft, wherein the aircraft has a negative thrust and/or is reducing in airspeed velocity. For example, and without limitation, regenerative drag operation may include a positive propeller speed and a negative propeller thrust. Regenerative drag operation may alternatively or additionally include any regenerative drag operation as described in U.S. Nonprovisional application Ser. No. 17/319,155. Flight controller 124 may efficaciously include any flight controllers as disclosed in U.S. Nonprovisional application Ser. No. 17/319,155, filed on May 13, 2021, and entitled "AIRCRAFT HAVING REVERSE THRUST CAPABILITIES".

In an embodiment, and still referring to FIG. 2, flight controller 124 may be configured to perform a corrective action as a function of a failure event. As used in this disclosure a "corrective action" is an action conducted by the plurality of flight components to correct and/or alter a movement of an aircraft. For example, and without limitation, a corrective action may include an action to reduce a yaw torque generated by a failure event. Additionally or alternatively, corrective action may include any corrective action as described in U.S. Nonprovisional application Ser. No. 17/222,539, filed on Apr. 5, 2021, and entitled "AIRCRAFT FOR SELF-NEUTRALIZING FLIGHT," the entirety of which is incorporated herein by reference. As used in this disclosure a "failure event" is a failure of a lift component of the plurality of lift components. For example, and without limitation, a failure event may denote a rotation degradation of a rotor, a reduced torque of a rotor, and the like thereof. Additionally or alternatively, failure event may include any failure event as described in U.S. Nonprovisional application Ser. No. 17/113,647, filed on Dec. 7, 2020, and entitled "IN-FLIGHT STABILIZATION OF AN AIRCAFT," the entirety of which is incorporated herein by reference. Flight controller 124 may efficaciously include any flight controllers as disclosed in U.S. Nonprovisional application. Ser. Nos. 17/222,539 and 17/113,647.

With continued reference to FIG. 2, flight controller 124 may include one or more computing devices. Computing device may include any computing device as described in this disclosure. Flight controller 124 may be onboard aircraft 200 and/or flight controller 124 may be remote from aircraft 200, as long as, in some embodiments, flight controller 124 is communicatively connected to aircraft 200. As used in this disclosure, "remote" is a spatial separation between two or more elements, systems, components or devices. Stated differently, two elements may be remote from one another if they are physically spaced apart. In an embodiment, flight controller 124 may include a proportional-integral-derivative (PID) controller.

Now referring to FIG. 3, an exemplary embodiment 300 of a flight controller 304 is illustrated. (Flight controller 124 of FIG. 1 and FIG. 2 may be the same as or similar to flight controller 304.) As used in this disclosure a "flight controller" is a computing device of a plurality of computing devices dedicated to data storage, security, distribution of traffic for load balancing, and flight instruction. Flight controller 304 may include and/or communicate with any computing device as described in this disclosure, including without limitation a microcontroller, microprocessor, digital signal processor (DSP) and/or system on a chip (SoC) as described in this disclosure. Further, flight controller 304 may include a single computing device operating independently, or may include two or more computing device operating in concert, in parallel, sequentially or the like; two or more computing devices may be included together in a single computing device or in two or more computing devices. In embodiments, flight controller 304 may be installed in an aircraft, may control the aircraft remotely, and/or may include an element installed in the aircraft and a remote element in communication therewith.

In an embodiment, and still referring to FIG. 3, flight controller 304 may include a signal transformation component 308. As used in this disclosure a "signal transformation component" is a component that transforms and/or converts a first signal to a second signal, wherein a signal may include one or more digital and/or analog signals. For example, and without limitation, signal transformation component 308 may be configured to perform one or more operations such as preprocessing, lexical analysis, parsing, semantic analysis, and the like thereof. In an embodiment, and without limitation, signal transformation component 308 may include one or more analog-to-digital convertors that transform a first signal of an analog signal to a second signal of a digital signal. For example, and without limitation, an analog-to-digital converter may convert an analog input signal to a 10-bit binary digital representation of that signal. In another embodiment, signal transformation component 308 may include transforming one or more low-level languages such as, but not limited to, machine languages and/or assembly languages. For example, and without limitation, signal transformation component 308 may include transforming a binary language signal to an assembly language signal. In an embodiment, and without limitation, signal transformation component 308 may include transforming one or more high-level languages and/or formal languages such as but not limited to alphabets, strings, and/or languages. For example, and without limitation, high-level languages may include one or more system languages, scripting languages, domain-specific languages, visual languages, esoteric languages, and the like thereof. As a further non-limiting example, high-level languages may include one or more algebraic formula languages, business data languages, string and list languages, object-oriented languages, and the like thereof.

Still referring to FIG. 3, signal transformation component 308 may be configured to optimize an intermediate representation 312. As used in this disclosure an "intermediate representation" is a data structure and/or code that represents the input signal. Signal transformation component 308 may optimize intermediate representation as a function of a data-flow analysis, dependence analysis, alias analysis, pointer analysis, escape analysis, and the like thereof. In an embodiment, and without limitation, signal transformation component 308 may optimize intermediate representation 312 as a function of one or more inline expansions, dead code eliminations, constant propagation, loop transformations, and/or automatic parallelization functions. In another embodiment, signal transformation component 308 may optimize intermediate representation as a function of a machine dependent optimization such as a peephole optimization, wherein a peephole optimization may rewrite short sequences of code into more efficient sequences of code. Signal transformation component 308 may optimize intermediate representation to generate an output language, wherein an "output language," as used herein, is the native machine language of flight controller 304. For example, and without limitation, native machine language may include one or more binary and/or numerical languages.

In an embodiment, and without limitation, signal transformation component 308 may include transform one or more inputs and outputs as a function of an error correction code. An error correction code, also known as error correcting code (ECC), is an encoding of a message or lot of data using redundant information, permitting recovery of corrupted data. An ECC may include a block code, in which information is encoded on fixed-size packets and/or blocks of data elements such as symbols of predetermined size, bits, or the like. Reed-Solomon coding, in which message symbols within a symbol set having q symbols are encoded as coefficients of a polynomial of degree less than or equal to a natural number k, over a finite field F with q elements; strings so encoded have a minimum hamming distance of k+1, and permit correction of (q−k−1)/2 erroneous symbols. Block code may alternatively or additionally be implemented using Golay coding, also known as binary Golay coding, Bose-Chaudhuri, Hocquenghuem (BCH) coding, multidimensional parity-check coding, and/or Hamming codes. An ECC may alternatively or additionally be based on a convolutional code.

In an embodiment, and still referring to FIG. 3, flight controller 304 may include a reconfigurable hardware platform 316. A "reconfigurable hardware platform," as used herein, is a component and/or unit of hardware that may be reprogrammed, such that, for instance, a data path between elements such as logic gates or other digital circuit elements may be modified to change an algorithm, state, logical sequence, or the like of the component and/or unit. This may be accomplished with such flexible high-speed computing fabrics as field-programmable gate arrays (FPGAs), which may include a grid of interconnected logic gates, connections between which may be severed and/or restored to program in modified logic. Reconfigurable hardware platform 316 may be reconfigured to enact any algorithm and/or algorithm selection process received from another computing device and/or created using machine-learning processes.

Still referring to FIG. 3, reconfigurable hardware platform 316 may include a logic component 320. As used in this disclosure a "logic component" is a component that executes instructions on output language. For example, and without limitation, logic component may perform basic arithmetic, logic, controlling, input/output operations, and the like thereof. Logic component 320 may include any suitable processor, such as without limitation a component incorporating logical circuitry for performing arithmetic and logical operations, such as an arithmetic and logic unit (ALU), which may be regulated with a state machine and directed by operational inputs from memory and/or sensors; logic component 320 may be organized according to Von Neumann and/or Harvard architecture as a non-limiting example. Logic component 320 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC). In an embodiment, logic component 320 may include one or more integrated circuit microprocessors, which may contain one or more central processing units, central processors, and/or main processors, on a single metal-oxide-semiconductor chip. Logic component 320 may be configured to execute a sequence of stored instructions to be performed on the output language and/or intermediate representation 312. Logic component 320 may be configured to fetch and/or retrieve the instruction from a memory cache, wherein a "memory cache," as used in this disclosure, is a stored instruction set on flight controller 304. Logic component 320 may be configured to decode the instruction retrieved from the memory cache to opcodes and/or operands. Logic component 320 may be configured to execute the instruction on intermediate representation 312 and/or output language. For example, and without limitation, logic component 320 may be configured to execute an addition operation on intermediate representation 312 and/or output language.

In an embodiment, and without limitation, logic component 320 may be configured to calculate a flight element 324. As used in this disclosure a "flight element" is an element of datum denoting a relative status of aircraft. For example, and without limitation, flight element 324 may denote one or more torques, thrusts, airspeed velocities, forces, altitudes, groundspeed velocities, directions during flight, directions facing, forces, orientations, and the like thereof. For example, and without limitation, flight element 324 may denote that aircraft is cruising at an altitude and/or with a sufficient magnitude of forward thrust. As a further non-limiting example, flight status may denote that is building thrust and/or groundspeed velocity in preparation for a takeoff. As a further non-limiting example, flight element 324 may denote that aircraft is following a flight path accurately and/or sufficiently.

Still referring to FIG. 3, flight controller 304 may include a chipset component 328. As used in this disclosure a "chipset component" is a component that manages data flow. In an embodiment, and without limitation, chipset component 328 may include a northbridge data flow path, wherein the northbridge dataflow path may manage data flow from logic component 320 to a high-speed device and/or component, such as a RAM, graphics controller, and the like thereof. In another embodiment, and without limitation, chipset component 328 may include a southbridge data flow path, wherein the southbridge dataflow path may manage data flow from logic component 320 to lower-speed peripheral buses, such as a peripheral component interconnect (PCI), industry standard architecture (ICA), and the like thereof. In an embodiment, and without limitation, southbridge data flow path may include managing data flow between peripheral connections such as ethernet, USB, audio devices, and the like thereof. Additionally or alternatively, chipset component 328 may manage data flow between logic component 320, memory cache, and a flight component 208. As used in this disclosure (and with particular reference to FIG. 3) a "flight component" is a portion of an aircraft that can be moved or adjusted to affect one or more flight elements. For example, flight component 208 may include a component used to affect the aircrafts' roll and pitch which may comprise one or more ailerons. As a further example, flight component 208 may include a rudder to control yaw of an aircraft. In an embodiment, chipset component 328 may be configured to communicate with a plurality of flight components as a function of flight element 324. For example, and without limitation, chipset component 328 may transmit to an aircraft rotor to reduce torque of a first lift propulsor and increase the forward thrust produced by a pusher component to perform a flight maneuver.

In an embodiment, and still referring to FIG. 3, flight controller 304 may be configured generate an autonomous function. As used in this disclosure an "autonomous function" is a mode and/or function of flight controller 304 that controls aircraft automatically. For example, and without limitation, autonomous function may perform one or more aircraft maneuvers, take offs, landings, altitude adjustments, flight leveling adjustments, turns, climbs, and/or descents. As a further non-limiting example, autonomous function may adjust one or more airspeed velocities, thrusts, torques, and/or groundspeed velocities. As a further non-limiting example, autonomous function may perform one or more flight path corrections and/or flight path modifications as a function of flight element 324. In an embodiment, autonomous function may include one or more modes of autonomy such as, but not limited to, autonomous mode, semi-autonomous mode, and/or non-autonomous mode. As used in this disclosure "autonomous mode" is a mode that automatically adjusts and/or controls aircraft and/or the maneuvers of aircraft in its entirety. For example, autonomous mode may denote that flight controller 304 will adjust the aircraft. As used in this disclosure a "semi-autonomous mode" is a mode that automatically adjusts and/or controls a portion and/or section of aircraft. For example, and without limitation, semi-autonomous mode may denote that a pilot will control the propulsors, wherein flight controller 304 will control the ailerons and/or rudders. As used in this disclosure "non-autonomous mode" is a mode that denotes a pilot will control aircraft and/or maneuvers of aircraft in its entirety.

In an embodiment, and still referring to FIG. 3, flight controller 304 may generate autonomous function as a function of an autonomous machine-learning model. As used in this disclosure an "autonomous machine-learning model" is a machine-learning model to produce an autonomous function output given flight element 324 and a pilot signal 336 as inputs; this is in contrast to a non-machine learning software program where the commands to be executed are determined in advance by a user and written in a programming language. As used in this disclosure a "pilot signal" is an element of datum representing one or more functions a pilot is controlling and/or adjusting. For example, pilot signal 336 may denote that a pilot is controlling and/or maneuvering ailerons, wherein the pilot is not in control of the rudders and/or propulsors. In an embodiment, pilot signal 336 may include an implicit signal and/or an explicit signal. For example, and without limitation, pilot signal 336 may include an explicit signal, wherein the pilot explicitly states there is a lack of control and/or desire for autonomous function. As a further non-limiting example, pilot signal 336 may include an explicit signal directing flight controller 304 to control and/or maintain a portion of aircraft, a portion of the flight plan, the entire aircraft, and/or the entire flight plan. As a further non-limiting example, pilot signal 336 may include an implicit signal, wherein flight controller 304 detects a lack of control such as by a malfunction, torque alteration, flight path deviation, and the like thereof. In an embodiment, and without limitation, pilot signal 336 may include one or more explicit signals to reduce torque, and/or one or more implicit signals that torque may be reduced due to reduction of airspeed velocity. In an embodiment, and without limitation, pilot signal 336 may include one or more local and/or global signals. For example, and without limitation, pilot signal 336 may include a local signal that is transmitted by a pilot and/or crew member. As a further non-limiting example, pilot signal 336 may include a global signal that is transmitted by air traffic control and/or one or more remote users that are in communication with the pilot of aircraft. In an embodiment, pilot signal 336 may be received as a function of a tri-state bus and/or multiplexor that denotes an explicit pilot signal should be transmitted prior to any implicit or global pilot signal.

Still referring to FIG. 3, autonomous machine-learning model may include one or more autonomous machine-learning processes such as supervised, unsupervised, or reinforcement machine-learning processes that flight controller 304 and/or a remote device may or may not use in the generation of autonomous function. As used in this disclosure "remote device" is an external device to flight controller 304. Additionally or alternatively, autonomous machine-learning model may include one or more autonomous machine-learning processes that a field-programmable gate array (FPGA) may or may not use in the generation of autonomous function. Autonomous machine-learning process may include, without limitation machine learning processes such as simple linear regression, multiple linear regression, polynomial regression, support vector regression, ridge regression, lasso regression, elasticnet regression, decision tree regression, random forest regression, logistic regression, logistic classification, K-nearest neighbors, support vector machines, kernel support vector machines, naïve bayes, decision tree classification, random forest classification, K-means clustering, hierarchical clustering, dimensionality reduction, principal component analysis, linear discriminant analysis, kernel principal component analysis, Q-learning, State Action Reward State Action (SARSA), Deep-Q network, Markov decision processes, Deep Deterministic Policy Gradient (DDPG), or the like thereof.

In an embodiment, and still referring to FIG. 3, autonomous machine learning model may be trained as a function of autonomous training data, wherein autonomous training data may correlate a flight element, pilot signal, and/or simulation data to an autonomous function. For example, and without limitation, a flight element of an airspeed velocity, a pilot signal of limited and/or no control of propulsors, and a simulation data of required airspeed velocity to reach the destination may result in an autonomous function that includes a semi-autonomous mode to increase thrust of the propulsors. Autonomous training data may be received as a function of user-entered valuations of flight elements, pilot signals, simulation data, and/or autonomous functions. Flight controller 304 may receive autonomous training data by receiving correlations of flight element, pilot signal, and/or simulation data to an autonomous function that were previously received and/or determined during a previous iteration of generation of autonomous function. Autonomous training data may be received by one or more remote devices and/or FPGAs that at least correlate a flight element, pilot signal, and/or simulation data to an autonomous function. Autonomous training data may be received in the form of one or more user-entered correlations of a flight element, pilot signal, and/or simulation data to an autonomous function.

Still referring to FIG. 3, flight controller 304 may receive autonomous machine-learning model from a remote device and/or FPGA that utilizes one or more autonomous machine learning processes, wherein a remote device and an FPGA is described above in detail. For example, and without limitation, a remote device may include a computing device, external device, processor, FPGA, microprocessor and the like thereof. Remote device and/or FPGA may perform the autonomous machine-learning process using autonomous training data to generate autonomous function and transmit the output to flight controller 304. Remote device and/or FPGA may transmit a signal, bit, datum, or parameter to flight controller 304 that at least relates to autonomous function. Additionally or alternatively, the remote device and/or FPGA may provide an updated machine-learning model. For example, and without limitation, an updated machine-learning model may be comprised of a firmware update, a software update, an autonomous machine-learning process correction, and the like thereof. As a non-limiting example a software update may incorporate a new simulation data that relates to a modified flight element. Additionally or alternatively, the updated machine learning model may be transmitted to the remote device and/or FPGA, wherein the remote device and/or FPGA may replace the autonomous machine-learning model with the updated machine-learning model and generate the autonomous function as a function of the flight element, pilot signal, and/or simulation data using the updated machine-learning model. The updated machine-learning model may be transmitted by the remote device and/or FPGA and received by flight controller 304 as a software update, firmware update, or corrected autonomous machine-learning model. For example, and without limitation autonomous machine learning model may utilize a neural net machine-learning process, wherein the updated machine-learning model may incorporate a gradient boosting machine-learning process.

Still referring to FIG. 3, flight controller 304 may include, be included in, and/or communicate with a mobile device such as a mobile telephone or smartphone. Further, flight controller may communicate with one or more additional devices as described below in further detail via a network interface device. The network interface device may be utilized for commutatively connecting a flight controller to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. The network may include any network topology and can may employ a wired and/or a wireless mode of communication.

In an embodiment, and still referring to FIG. 3, flight controller 304 may include, but is not limited to, for example, a cluster of flight controllers in a first location and a second flight controller or cluster of flight controllers in a second location. Flight controller 304 may include one or more flight controllers dedicated to data storage, security, distribution of traffic for load balancing, and the like. Flight controller 304 may be configured to distribute one or more computing tasks as described below across a plurality of flight controllers, which may operate in parallel, in series, redundantly, or in any other manner used for distribution of tasks or memory between computing devices. For example, and without limitation, flight controller 304 may implement a control algorithm to distribute and/or command the plurality of flight controllers. As used in this disclosure a "control algorithm" is a finite sequence of well-defined computer implementable instructions that may determine the flight component of the plurality of flight components to be adjusted. For example, and without limitation, control algorithm may include one or more algorithms that reduce and/or prevent aviation asymmetry. As a further non-limiting example, control algorithms may include one or more models generated as a function of a software including, but not limited to Simulink by MathWorks, Natick, Mass., USA. In an embodiment, and without limitation, control algorithm may be configured to generate an auto-code, wherein an "auto-code," is used herein, is a code and/or algorithm that is generated as a function of the one or more models and/or software's. In another embodiment, control algorithm may be configured to produce a segmented control algorithm. As used in this disclosure a "segmented control algorithm" is control algorithm that has been separated and/or parsed into discrete sections. For example, and without limitation, segmented control algorithm may parse control algorithm into two or more segments, wherein each segment of control algorithm may be performed by one or more flight controllers operating on distinct flight components.

In an embodiment, and still referring to FIG. 3, control algorithm may be configured to determine a segmentation boundary as a function of segmented control algorithm. As used in this disclosure a "segmentation boundary" is a limit and/or delineation associated with the segments of the segmented control algorithm. For example, and without limitation, segmentation boundary may denote that a segment in the control algorithm has a first starting section and/or a first ending section. As a further non-limiting example, segmentation boundary may include one or more boundaries associated with an ability of flight component 208. In an embodiment, control algorithm may be configured to create an optimized signal communication as a function of segmentation boundary. For example, and without limitation, optimized signal communication may include identifying the discrete timing required to transmit and/or receive the one or more segmentation boundaries. In an embodiment, and without limitation, creating optimized signal communication further comprises separating a plurality of signal codes across the plurality of flight controllers. For example, and without limitation the plurality of flight controllers may include one or more formal networks, wherein formal networks transmit data along an authority chain and/or are limited to task-related communications. As a further non-limiting example, communication network may include informal networks, wherein informal networks transmit data in any direction. In an embodiment, and without limitation, the plurality of flight controllers may include a chain path, wherein a "chain path," as used herein, is a linear communication path comprising a hierarchy that data may flow through. In an embodiment, and without limitation, the plurality of flight controllers may include an all-channel path, wherein an "all-channel path," as used herein, is a communication path that is not restricted to a particular direction. For example, and without limitation, data may be transmitted upward, downward, laterally, and the like thereof. In an embodiment, and without limitation, the plurality of flight controllers may include one or more neural networks that assign a weighted value to a transmitted datum. For example, and without limitation, a weighted value may be assigned as a function of one or more signals denoting that a flight component is malfunctioning and/or in a failure state.

Still referring to FIG. 3, the plurality of flight controllers may include a master bus controller. As used in this disclosure a "master bus controller" is one or more devices and/or components that are connected to a bus to initiate a direct memory access transaction, wherein a bus is one or more terminals in a bus architecture. Master bus controller may communicate using synchronous and/or asynchronous bus control protocols. In an embodiment, master bus controller may include flight controller 304. In another embodiment, master bus controller may include one or more universal asynchronous receiver-transmitters (UART). For example, and without limitation, master bus controller may include one or more bus architectures that allow a bus to initiate a direct memory access transaction from one or more buses in the bus architectures. As a further non-limiting example, master bus controller may include one or more peripheral devices and/or components to communicate with another peripheral device and/or component and/or the master bus controller. In an embodiment, master bus controller may be configured to perform bus arbitration. As used in this disclosure "bus arbitration" is method and/or scheme to prevent multiple buses from attempting to communicate with and/or connect to master bus controller. For example and without limitation, bus arbitration may include one or more schemes such as a small computer interface system, wherein a small computer interface system is a set of standards for physical connecting and transferring data between peripheral devices and master bus controller by defining commands, protocols, electrical, optical, and/or logical interfaces. In an embodiment, master bus controller may receive intermediate representation 312 and/or output language from logic component 320, wherein output language may include one or more analog-to-digital conversions, low bit rate transmissions, message encryptions, digital signals, binary signals, logic signals, analog signals, and the like thereof described above in detail.

Still referring to FIG. 3, master bus controller may communicate with a slave bus. As used in this disclosure a "slave bus" is one or more peripheral devices and/or components that initiate a bus transfer. For example, and without limitation, slave bus may receive one or more controls and/or asymmetric communications from master bus controller, wherein slave bus transfers data stored to master bus controller. In an embodiment, and without limitation, slave bus may include one or more internal buses, such as but not limited to a/an internal data bus, memory bus, system bus, front-side bus, and the like thereof. In another embodiment, and without limitation, slave bus may include one or more external buses such as external flight controllers, external computers, remote devices, printers, aircraft computer systems, flight control systems, and the like thereof.

In an embodiment, and still referring to FIG. 3, control algorithm may optimize signal communication as a function of determining one or more discrete timings. For example, and without limitation master bus controller may synchronize timing of the segmented control algorithm by injecting high priority timing signals on a bus of the master bus control. As used in this disclosure a "high priority timing signal" is information denoting that the information is important. For example, and without limitation, high priority timing signal may denote that a section of control algorithm is of high priority and should be analyzed and/or transmitted prior to any other sections being analyzed and/or transmitted. In an embodiment, high priority timing signal may include one or more priority packets. As used in this disclosure a "priority packet" is a formatted unit of data that is communicated between the plurality of flight controllers. For example, and without limitation, priority packet may denote that a section of control algorithm should be used and/or is of greater priority than other sections.

Still referring to FIG. 3, flight controller 304 may also be implemented using a "shared nothing" architecture in which data is cached at the worker, in an embodiment, this may enable scalability of aircraft and/or computing device. Flight controller 304 may include a distributer flight controller. As used in this disclosure a "distributer flight controller" is a component that adjusts and/or controls a plurality of flight components as a function of a plurality of flight controllers. For example, distributer flight controller may include a flight controller that communicates with a plurality of additional flight controllers and/or clusters of flight controllers. In an embodiment, distributed flight control may include one or more neural networks. For example, neural network also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes, one or more intermediate layers, and an output layer of nodes. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 3, a node may include, without limitation a plurality of inputs $x_i$ that may receive numerical values from inputs to a neural network containing the node and/or from other nodes. Node may perform a weighted sum of inputs using weights $w_i$ that are multiplied by respective inputs $x_i$. Additionally or alternatively, a bias b may be added to the weighted sum of the inputs such that an offset is added to each unit in the neural network layer that is independent of the input to the layer. The weighted sum may then be input into a function $\varphi$, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above. In an embodiment, and without limitation, a neural network may receive semantic units as inputs and output vectors representing such semantic units according to weights $w_i$ that are derived using machine-learning processes as described in this disclosure.

Still referring to FIG. 3, flight controller may include a sub-controller 340. As used in this disclosure a "sub-controller" is a controller and/or component that is part of a distributed controller as described above; for instance, flight controller 304 may be and/or include a distributed flight controller made up of one or more sub-controllers. For example, and without limitation, sub-controller 340 may include any controllers and/or components thereof that are similar to distributed flight controller and/or flight controller as described above. Sub-controller 340 may include any component of any flight controller as described above. Sub-controller 340 may be implemented in any manner suitable for implementation of a flight controller as described above. As a further non-limiting example, sub-controller 340 may include one or more processors, logic components and/or computing devices capable of receiving, processing, and/or transmitting data across the distributed flight controller as described above. As a further non-limiting example, sub-controller 340 may include a controller that receives a signal from a first flight controller and/or first distributed flight controller component and transmits the signal to a plurality of additional sub-controllers and/or flight components.

Still referring to FIG. 3, flight controller may include a co-controller 344. As used in this disclosure a "co-controller" is a controller and/or component that joins flight controller 304 as components and/or nodes of a distributer flight controller as described above. For example, and without limitation, co-controller 344 may include one or more controllers and/or components that are similar to flight controller 304. As a further non-limiting example, co-controller 344 may include any controller and/or component that joins flight controller 304 to distributer flight controller. As a further non-limiting example, co-controller 344 may include one or more processors, logic components and/or computing devices capable of receiving, processing, and/or transmitting data to and/or from flight controller 304 to distributed flight control system. Co-controller 344 may include any component of any flight controller as described above. Co-controller 344 may be implemented in any manner suitable for implementation of a flight controller as described above.

In an embodiment, and with continued reference to FIG. 3, flight controller 304 may be designed and/or configured to perform any method, method step, or sequence of method steps in any embodiment described in this disclosure, in any order and with any degree of repetition. For instance, flight controller 304 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Flight controller may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Figure 4:
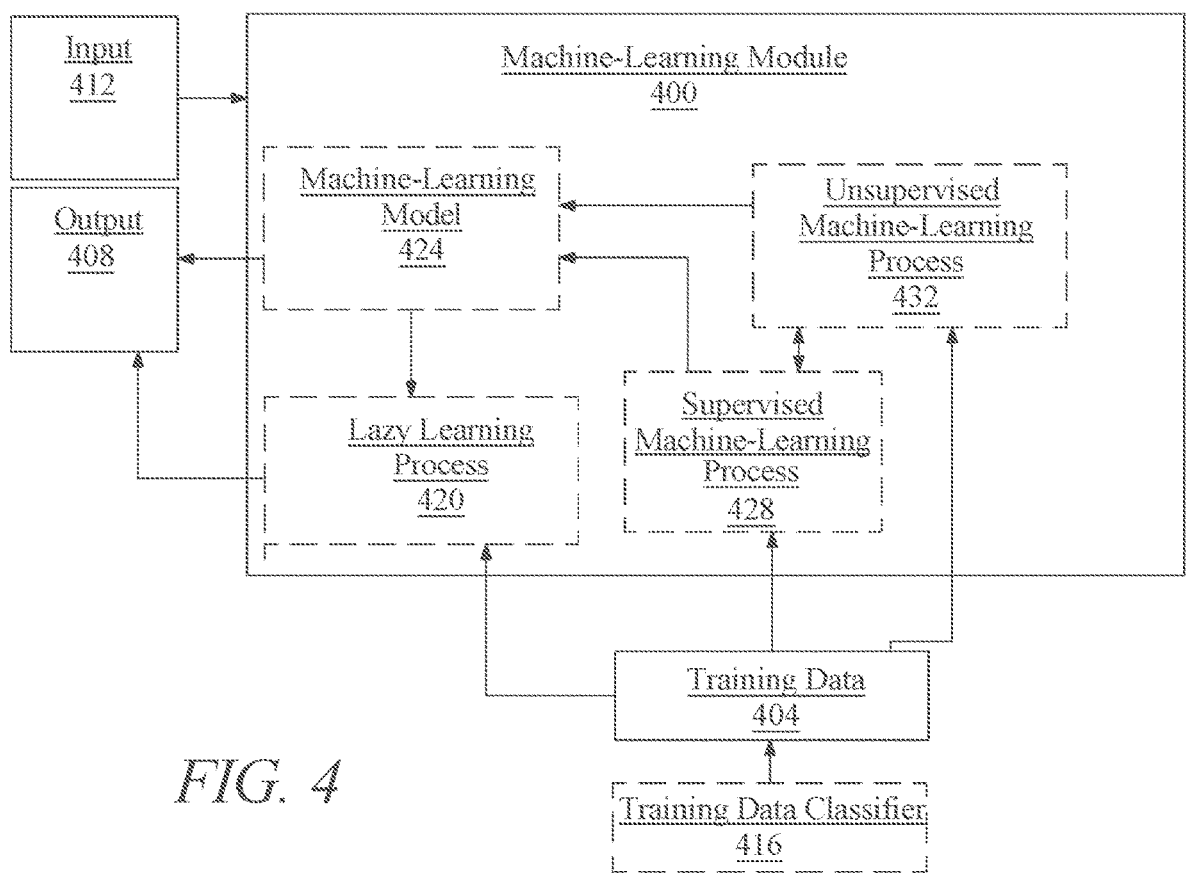
FIG. 4 is a block diagram of an exemplary embodiment of a machine-learning module.

Referring now to FIG. 4, an exemplary embodiment of a machine-learning module 400 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 404 to generate an algorithm that will be performed by a computing device/module to produce outputs 408 given data provided as inputs 412; this is in contrast to a non-machine learning software program where the commands to be executed are determined in advance by a user and written in a programming language.

Still referring to FIG. 4, "training data," as used herein, is data containing correlations that a machine-learning process may use to model relationships between two or more categories of data elements. For instance, and without limitation, training data 404 may include a plurality of data entries, each entry representing a set of data elements that were recorded, received, and/or generated together; data elements may be correlated by shared existence in a given data entry, by proximity in a given data entry, or the like. Multiple data entries in training data 404 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 404 according to various correlations; correlations may indicate causative and/or predictive links between categories of data elements, which may be modeled as relationships such as mathematical relationships by machine-learning processes as described in further detail below. Training data 404 may be formatted and/or organized by categories of data elements, for instance by associating data elements with one or more descriptors corresponding to categories of data elements. As a non-limiting example, training data 404 may include data entered in standardized forms by persons or processes, such that entry of a given data element in a given field in a form may be mapped to one or more descriptors of categories. Elements in training data 404 may be linked to descriptors of categories by tags, tokens, or other data elements; for instance, and without limitation, training data 404 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 4, training data 404 may include one or more elements that are not categorized; that is, training data 404 may not be formatted or contain descriptors for some elements of data. Machine-learning algorithms and/or other processes may sort training data 404 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 404 to be made applicable for two or more distinct machine-learning algorithms as described in further detail below. Training data 404 used by machine-learning module 400 may correlate any input data as described in this disclosure to any output data as described in this disclosure. As a non-limiting illustrative example flight elements and/or pilot signals may be inputs, wherein an output may be an autonomous function.

Further referring to FIG. 4, training data may be filtered, sorted, and/or selected using one or more supervised and/or unsupervised machine-learning processes and/or models as described in further detail below; such models may include without limitation a training data classifier 416. Training data classifier 416 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 400 may generate a classifier using a classification algorithm, defined as a processes whereby a computing device and/or any module and/or component operating thereon derives a classifier from training data 404. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. As a non-limiting example, training data classifier 416 may classify elements of training data to sub-categories of flight elements such as torques, forces, thrusts, directions, and the like thereof.

Still referring to FIG. 4, machine-learning module 400 may be configured to perform a lazy-learning process 420 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 404. Heuristic may include selecting some number of highest-ranking associations and/or training data 404 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 4, machine-learning processes as described in this disclosure may be used to generate machine-learning models 424. A "machine-learning model," as used in this disclosure, is a mathematical and/or algorithmic representation of a relationship between inputs and outputs, as generated using any machine-learning process including without limitation any process as described above, and stored in memory; an input is submitted to a machine-learning model 424 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 424 may be generated by creating an artificial neural network, such as a convolutional neural network comprising an input layer of nodes, one or more intermediate layers, and an output layer of nodes. Connections between nodes may be created via the process of "training" the network, in which elements from a training data 404 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 4, machine-learning algorithms may include at least a supervised machine-learning process 428. At least a supervised machine-learning process 428, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include flight elements and/or pilot signals as described above as inputs, autonomous functions as outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 404. Persons skilled in the art, upon reviewing the entirety of this disclosure, will be aware of various possible variations of at least a supervised machine-learning process 428 that may be used to determine relation between inputs and outputs. Supervised machine-learning processes may include classification algorithms as defined above.

Further referring to FIG. 4, machine learning processes may include at least an unsupervised machine-learning processes 432. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 4, machine-learning module 400 may be designed and configured to create a machine-learning model 424 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 4, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

Figure 5:
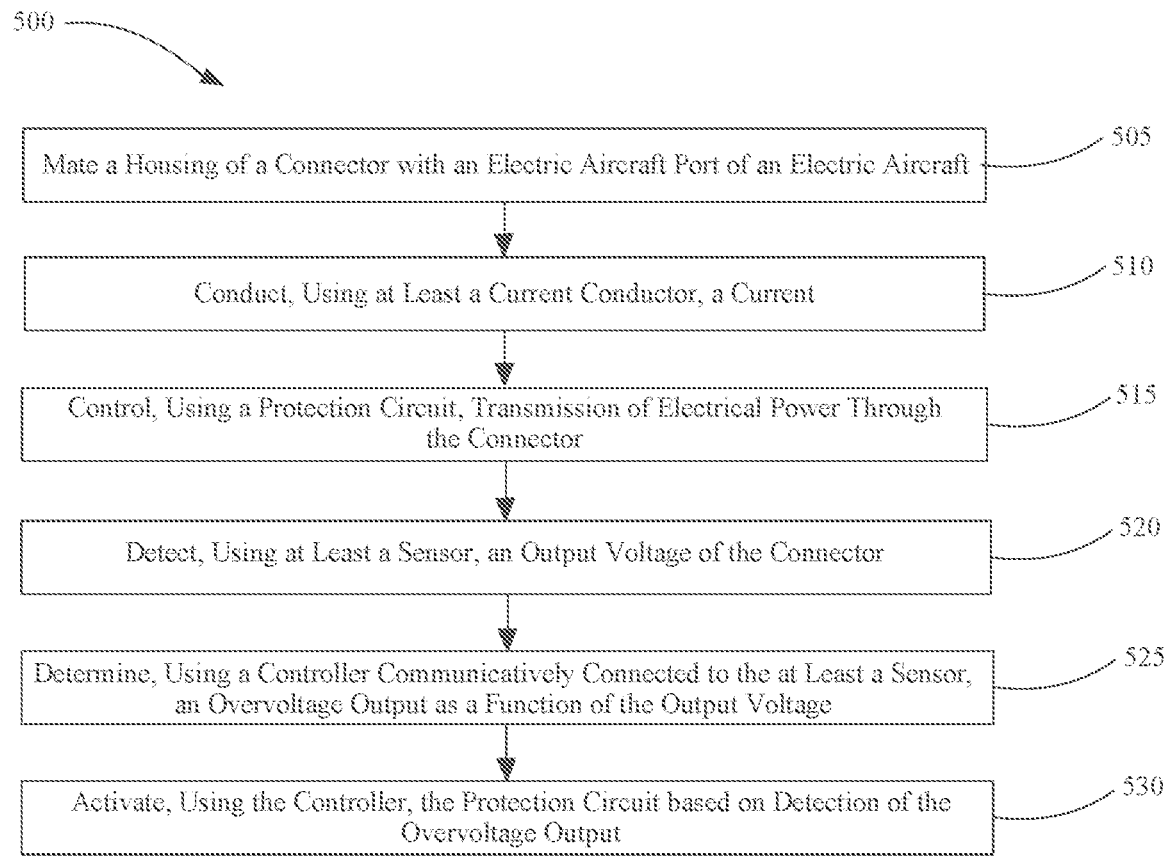
FIG. 5 is a block diagram of an exemplary embodiment of a method, of using a connector with overvoltage protection, for charging an electric aircraft.

Now referring to FIG. 5, an exemplary embodiment of a method, of using a connector with overvoltage protection, for charging an electric aircraft is illustrated. Electric aircraft may be any of the aircrafts as disclosed herein and described above with reference to at least FIG. 1 and FIG. 2. In an embodiment, electric aircraft may include an electric vertical takeoff and landing (eVTOL) aircraft. Connector may include any of the connectors as disclosed herein and described above with reference to at least FIG. 1.

Still referring to FIG. 5, at step 505, a housing of connector is mated with an electric aircraft port of electric aircraft. Housing may include any of the housings as disclosed herein and described above with reference to at least FIG. 1. Electric aircraft port may include any of the electric aircraft ports as disclosed herein and described above with reference to at least FIG. 1.

Still referring to FIG. 5, at step 510, a current is conducted using at least a current conductor. Current conductor may include any of the current conductors as disclosed herein and described above with reference to at least FIG. 1.

Still referring to FIG. 5, at step 515, transmission of electrical power through connector is controlled using a protection circuit. Protection circuit may include any of the protection circuits as disclosed herein and described above with reference to at least FIG. 1.

Still referring to FIG. 5, at step 520, an output voltage of connector is detected using at least a sensor. Output voltage may include any of the output voltages as disclosed herein and described above with reference to at least FIG. 1. Sensor may include any of the sensors as disclosed herein and described above with reference to at least FIG. 1. Detection may include any means as disclosed in the entirety of the present disclosure.

Still referring to FIG. 5, at step 525, an overvoltage output is determined, as a function of output voltage, using a controller communicatively connected to at least a sensor. Overvoltage output may include any of the overvoltage outputs as disclosed herein and described above with reference to at least FIG. 1. Controller may include any of the controllers as disclosed herein and described above with reference to at least FIG. 1. Determination may include any means as disclosed in the entirety of the present disclosure.

Continuing to refer to FIG. 5, at step 530, protection circuit is activated, based on detection of overvoltage output, using controller. Activation may include any means as disclosed in the entirety of the present disclosure.

With continued reference to FIG. 5, step 505 of mating housing of connector with electric aircraft port further includes connecting at least a current conductor with a mating component on electric aircraft port. Mating component may include any of the mating components as disclosed herein and described above with reference to at least FIG. 1.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 6:
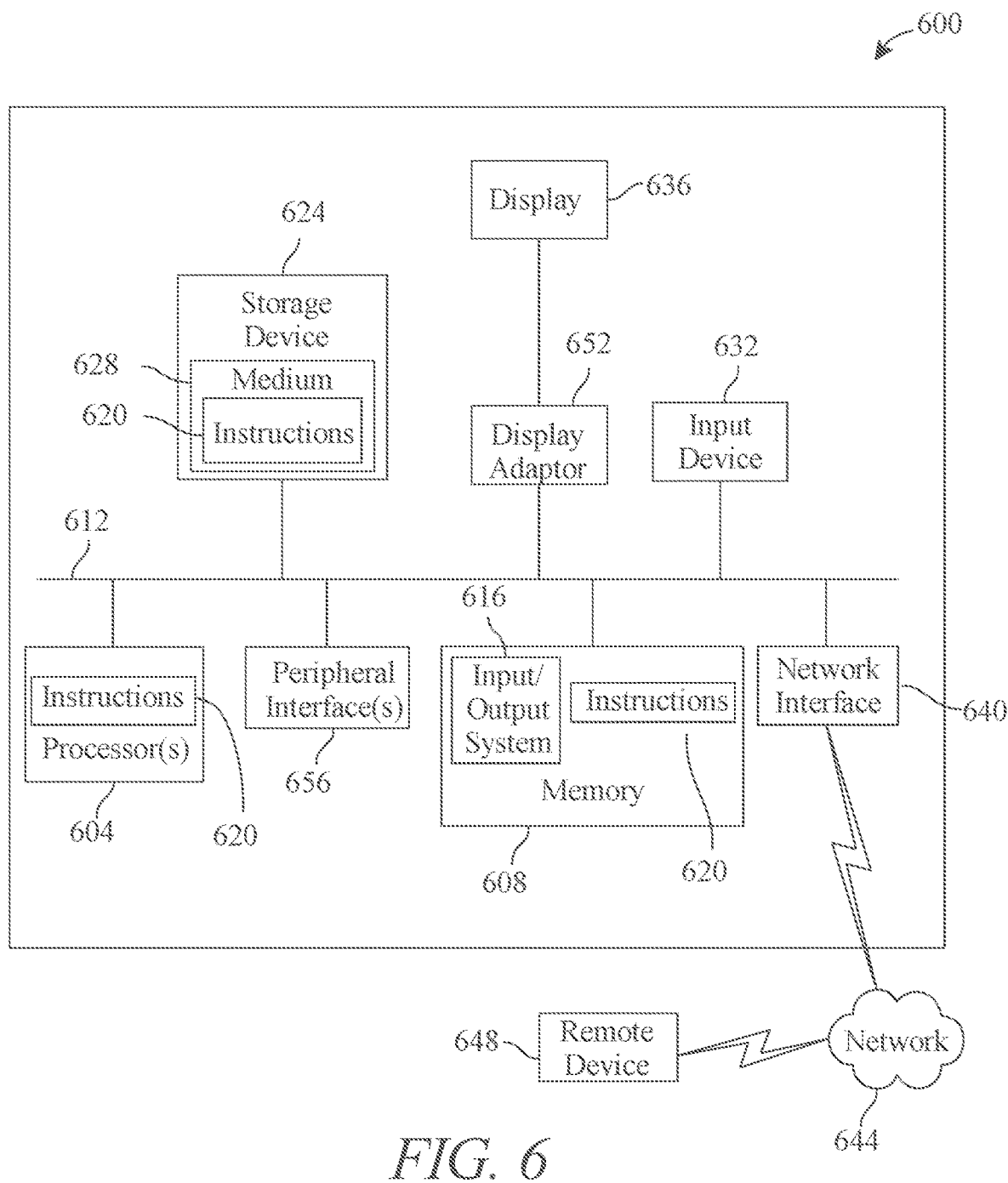
FIG. 6 is a block diagram of a computing system that can be used to implement any one or more of the methodologies disclosed herein and any one or more portions thereof.

FIG. 6 shows a diagrammatic representation of one embodiment of a computing device in the exemplary form of a computer system 600 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 600 includes a processor 604 and a memory 608 that communicate with each other, and with other components, via a bus 612. Bus 612 may include any of several types of bus structures including, but not limited to, a memory bus, a memory controller, a peripheral bus, a local bus, and any combinations thereof, using any of a variety of bus architectures.

Processor 604 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 604 may be organized according to Von Neumann and/or Harvard architecture as a non-limiting example. Processor 604 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 608 may include various components (e.g., machine-readable media) including, but not limited to, a random-access memory component, a read only component, and any combinations thereof. In one example, a basic input/output system 616 (BIOS), including basic routines that help to transfer information between elements within computer system 600, such as during start-up, may be stored in memory 608. Memory 608 may also include (e.g., stored on one or more machine-readable media) instructions (e.g., software) 620 embodying any one or more of the aspects and/or methodologies of the present disclosure. In another example, memory 608 may further include any number of program modules including, but not limited to, an operating system, one or more application programs, other program modules, program data, and any combinations thereof.

Computer system 600 may also include a storage device 624. Examples of a storage device (e.g., storage device 624)

include, but are not limited to, a hard disk drive, a magnetic disk drive, an optical disc drive in combination with an optical medium, a solid-state memory device, and any combinations thereof. Storage device 624 may be connected to bus 612 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 624 (or one or more components thereof) may be removably interfaced with computer system 600 (e.g., via an external port connector (not shown)). Particularly, storage device 624 and an associated machine-readable medium 628 may provide nonvolatile and/or volatile storage of machine-readable instructions, data structures, program modules, and/or other data for computer system 600. In one example, software 620 may reside, completely or partially, within machine-readable medium 628. In another example, software 620 may reside, completely or partially, within processor 604.

Computer system 600 may also include an input device 632. In one example, a user of computer system 600 may enter commands and/or other information into computer system 600 via input device 632. Examples of an input device 632 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 632 may be interfaced to bus 612 via any of a variety of interfaces (not shown) including, but not limited to, a serial interface, a parallel interface, a game port, a USB interface, a FIREWIRE interface, a direct interface to bus 612, and any combinations thereof. Input device 632 may include a touch screen interface that may be a part of or separate from display 636, discussed further below. Input device 632 may be utilized as a user selection device for selecting one or more graphical representations in a graphical interface as described above.

A user may also input commands and/or other information to computer system 600 via storage device 624 (e.g., a removable disk drive, a flash drive, etc.) and/or network interface device 640. A network interface device, such as network interface device 640, may be utilized for connecting computer system 600 to one or more of a variety of networks, such as network 644, and one or more remote devices 648 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 644, may employ a wired and/or a wireless mode of communication. In general, any network topology may be used. Information (e.g., data, software 620, etc.) may be communicated to and/or from computer system 600 via network interface device 640.

Computer system 600 may further include a video display adapter 652 for communicating a displayable image to a display device, such as display device 636. Examples of a display device include, but are not limited to, a liquid crystal display (LCD), a cathode ray tube (CRT), a plasma display, a light emitting diode (LED) display, and any combinations thereof. Display adapter 652 and display device 636 may be utilized in combination with processor 604 to provide graphical representations of aspects of the present disclosure. In addition to a display device, computer system 600 may include one or more other peripheral output devices including, but not limited to, an audio speaker, a printer, and any combinations thereof. Such peripheral output devices may be connected to bus 612 via a peripheral interface 656. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods and systems according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A connector with overvoltage protection for charging an electric aircraft, the connector comprising:
   a housing configured to mate with an electric aircraft port of an electric aircraft;
   at least a current conductor configured to conduct a current, wherein the at least a current conductor is configured to make a connection with a mating component on the electric aircraft port when the housing is mated with the electric aircraft port;
   a protection circuit configured to control transmission of electrical power through the connector;
   a proximity sensor electrically communicative with a proximity signal conductor, wherein the proximity sensor is configured to generate a proximity signal as a function of the connection of the connector with the mating component on the electric aircraft port;
   at least a sensor configured to detect an output voltage of the connector; and
   a controller communicatively connected to the at least a sensor, wherein the controller is configured to:
      determine a proximity between the mating component on the electric aircraft port and the connector as a function of the proximity signal;
      determine an overvoltage output as a function of the output voltage, wherein determining the overvoltage output further comprises comparing the output voltage to a threshold voltage, and wherein the threshold voltage is predetermined; and activate the protection circuit based on detection of the overvoltage output and the proximity between the mating component of the electric aircraft port and the connector.

2. The connector of claim 1, wherein the connector is configured to charge at least a battery of the electric aircraft.

3. The connector of claim 1, wherein the connector further comprises a control pilot configured to conduct a control signal.

4. The connector of claim 1, wherein the protection circuit comprises a Zener circuit.

5. The connector of claim 1, wherein the overvoltage output is determined as a function of a state of charge of at least a battery of the electric aircraft.

6. The connector of claim 1, wherein activating the protection circuit comprises tripping the protection circuit.

7. The connector of claim 1, wherein activating the protection circuit comprises terminating the transmission of electrical power through the connector.

8. The connector of claim 1, wherein activating the protection circuit comprises regulating the output voltage.

9. The connector of claim 1, wherein the at least a current conductor comprises an alternating current conductor configured to conduct an alternating current.

10. The connector of claim 1, wherein the at least a current conductor comprises a direct current conductor configured to conduct a direct current.

11. A method, of using a connector with overvoltage protection, for charging an electric aircraft, the method comprising:

mating a housing of a connector with an electric aircraft port of an electric aircraft;

conducting, using at least a current conductor, a current, wherein mating the housing with the electric aircraft port further comprises connecting the at least a current conductor with a mating component on the electric aircraft port;

controlling, using a protection circuit, transmission of electrical power through the connector;

detecting, using at least a sensor, an output voltage of the connector;

generating, using a proximity sensor electrically communicative with a proximity signal conductor, a proximity signal as a function of the connection of the connector with the mating component of the electric aircraft port;

determining, using the controller, a proximity between the mating component of the electric aircraft port and the connector as a function of the proximity signal;

determining, using a controller communicatively connected to the at least a sensor, an overvoltage output as a function of the output voltage, wherein determining the overvoltage output further comprises comparing the output voltage to a threshold voltage, and wherein the threshold voltage is predetermined; and activating, using the controller, the protection circuit based on detection of the overvoltage output and the proximity between the mating component of the electric aircraft port and the connector.

12. The method of claim 11, wherein the connector is configured to charge at least a battery of the electric aircraft.

13. The method of claim 11, wherein the connector further comprises a control pilot configured to conduct a control signal.

14. The method of claim 11, wherein the protection circuit comprises a Zener circuit.

15. The method of claim 11, wherein the overvoltage output is determined as a function of a state of charge of at least a battery of the electric aircraft.

16. The method of claim 11, wherein activating the protection circuit comprises tripping the protection circuit.

17. The method of claim 11, wherein activating the protection circuit comprises terminating the transmission of electrical power through the connector.

18. The method of claim 11, wherein activating the protection circuit comprises regulating the output voltage.

19. The method of claim 11, wherein the at least a current conductor comprises an alternating current conductor configured to conduct an alternating current.

20. The method of claim 11, wherein the at least a current conductor comprises a direct current conductor configured to conduct a direct current.

* * * * *